United States Patent
Tuominen et al.

(10) Patent No.: US 7,189,435 B2
(45) Date of Patent: Mar. 13, 2007

(54) NANOFABRICATION

(75) Inventors: Mark Tuominen, Shutesbury, MA (US); Mustafa Bal, Amherst, MA (US); Thomas P. Russell, Amherst, MA (US); Andrei Ursache, Amherst, MA (US)

(73) Assignee: University of Massachusetts, Boston, MA (US)

( * ) Notice: Subject to any disclaimer, the term of this patent is extended or adjusted under 35 U.S.C. 154(b) by 573 days.

(21) Appl. No.: 10/098,222

(22) Filed: Mar. 14, 2002

(65) Prior Publication Data

US 2002/0158342 A1    Oct. 31, 2002

(51) Int. Cl.
*H01F 41/30* (2006.01)
*C23C 18/00* (2006.01)
*H05K 3/00* (2006.01)
*H01B 13/00* (2006.01)
*B82B 3/00* (2006.01)

(52) U.S. Cl. ............... 427/472; 427/98.4; 427/259; 427/385.5; 427/407.1; 216/13; 216/18; 216/22; 216/49; 216/56

(58) Field of Classification Search ........... 427/472, 427/487, 495, 598, 243, 373, 259, 384, 385.5, 427/407.1, 98.4; 205/261; 216/13, 18, 22, 216/39, 49, 56; 977/755, 762, 778, 781, 977/783, 785, 788, 888
See application file for complete search history.

(56) References Cited

U.S. PATENT DOCUMENTS

| | | | |
|---|---|---|---|
| 4,789,648 A | 12/1988 | Chow et al. | 437/225 |
| 5,306,661 A | 4/1994 | Tonucci et al. | 437/90 |
| 5,948,470 A | 9/1999 | Harrison et al. | 427/198 |
| 6,185,961 B1 | 2/2001 | Tonucci et al. | 65/60.4 |
| 6,187,164 B1 | 2/2001 | Warren et al. | 205/81 |
| 6,187,165 B1 | 2/2001 | Chien et al. | 205/118 |
| 6,388,185 B1 | 5/2002 | Fleurial et al. | 136/205 |
| 2002/0055239 A1* | 5/2002 | Tuominen et al. | 438/466 |

FOREIGN PATENT DOCUMENTS

WO    WO 01/70873    * 9/2001

OTHER PUBLICATIONS

Andricacos, P.C. et al., "Damascene copper . . . ," IBM J. Res. Develop., 42(5):567-574, Sep. 1998.
Black, C.T. et al., "Spin-Dependent Tunneling . . . ," Science, 290:1131-1134, Nov. 2000.
Chou, Stephen Y. "Patterned Magnetic . . . ," Proceedings of the IEEE, 85(4), 652-671, Apr. 1997.
Han, Yong-Jin et al., "Preparation of Noble . . . ," Chem. Mater, 12:2068-2069, 2000, no month.
Hicks, L.D. et al., "Experimental study of the effect . . . ," Phys. Rev. B, 53(16):R10 493-R10 496, Apr. 1996.

(Continued)

Primary Examiner—Michael E. Lavilla
(74) Attorney, Agent, or Firm—Fish & Richardson P.C.

(57) ABSTRACT

Pathways to rapid and reliable fabrication of three-dimensional nanostructures are provided. Simple methods are described for the production of well-ordered, multilevel nanostructures. This is accomplished by patterning block copolymer templates with selective exposure to a radiation source. The resulting multi-scale lithographic template can be treated with post-fabrication steps to produce multilevel, three-dimensional, integrated nanoscale media, devices, and systems.

28 Claims, 20 Drawing Sheets

OTHER PUBLICATIONS

Hicks, L.D., "Thermoelectric figure . . . ," Phys. Rev. B, 47(24):16631-16634, Jun. 1993.

Hylton, T.L. et al., "Magnetostatically induced . . . ," Appl. Phys. Lett. 67(8):1154-1156, Aug. 1995.

Katine, J.A. et al., "Current-Driven Magnetization . . . ," Phys. Rev. Lett, 84(14):3149-3152, Apr. 2000.

Koike, Kazuyuki et al., "Magnetic block array . . . ," Appl. Phys. Lett., 78(6):784-786, Feb. 2001.

Lohau, J. et al., "Writing and reading . . . ," Appl. Phys. Lett., 78(7):990-992, Feb. 2001.

Martin, Charles R. et al., "Template-synthesized nanomaterials . . . ," Electroanalytical Chemistry, A.J. Bard and I. Rubinmstein, Eds., 21:1-74, 1999, no month.

Nakamura, Yoshihisa, "Perpendicular magnetic . . . ," Journal of Magnetism and Magnetic Materials, 200:634-648, 1999, no month.

Pignard, S. et al., "Study of the magnetization . . . ," 87(2):824-829, Jan. 2000.

Prinz, Gary A., Journal of Magnetism and Magnetic Materials 200:57-68, 1999, no month.

Ross, C. A. et al., "Fabrication of patterned . . . ," J. Vac. Sci. Technol. B 17(6):3168-3176, Nov./Dec. 1999.

Strijkers, G. J., "Structure and magnetization . . . ," Journal of Applied Physics, 86(9):5141-5145, Nov. 1999.

Thurn-Albrecht, T. et al., "Ultrahigh-Density Nanowire . . . ," Science, 290:2126-2129, Dec. 2000.

Thurn-Albrecht, Thomas et al., "Nanoscopic Templates . . . ," Adv. Mater., 12(11):787-791, 2000, no month.

Wang, Q. H., "Flat panel display prototype . . . ," Appl. Phys. Lett., 78(9):1294-1296, Feb. 2001.

Wegrowe, J-E. et al., "Magnetoresistance of Ferromagnetic . . . ," Phys. Rev. Lett., 82(18):3681-3684, May 1999.

Weller, Dieter et al., "Thermal Effect Limits . . . ," IEEE Transactions on Magnetics, 35(6):4423-4439, Nov. 1999.

Whitney, T. M. et al., "Fabrication and Magnetic Properties . . . ," Science, 261:1316-1319, Sep. 1993.

Zheng, H. et al., "Magnetic properties . . . ," Journal of Applied Physics, 87(9):4718-4720, May 2000.

S. Fan et al., "Self-Oriented Regular Arrays of Carbon Nanotubes and Their Field Emission Properties", *Science,* vol. 283, Jan. 22, 1999, pp. 512-514.

P. Mansky et al., "Monolayer Films of Diblock Copolymer Microdomains for Nanolithographic Applications", 1995 Chapman & Hall, pp. 1987-1992, no month.

Routkevitch et al., "Nonlithographic Nano-Wire Arrays: Fabrication, Physics, and Device Applications," IEEE Transactions on Electron Devices; 43(10):1646-1658; Oct. 1996.

\* cited by examiner electrode pattern crosslinked copolymer (solid film)

nanoporous array template unexposed copolymer (solid film)

vertical nanowire field-emitters

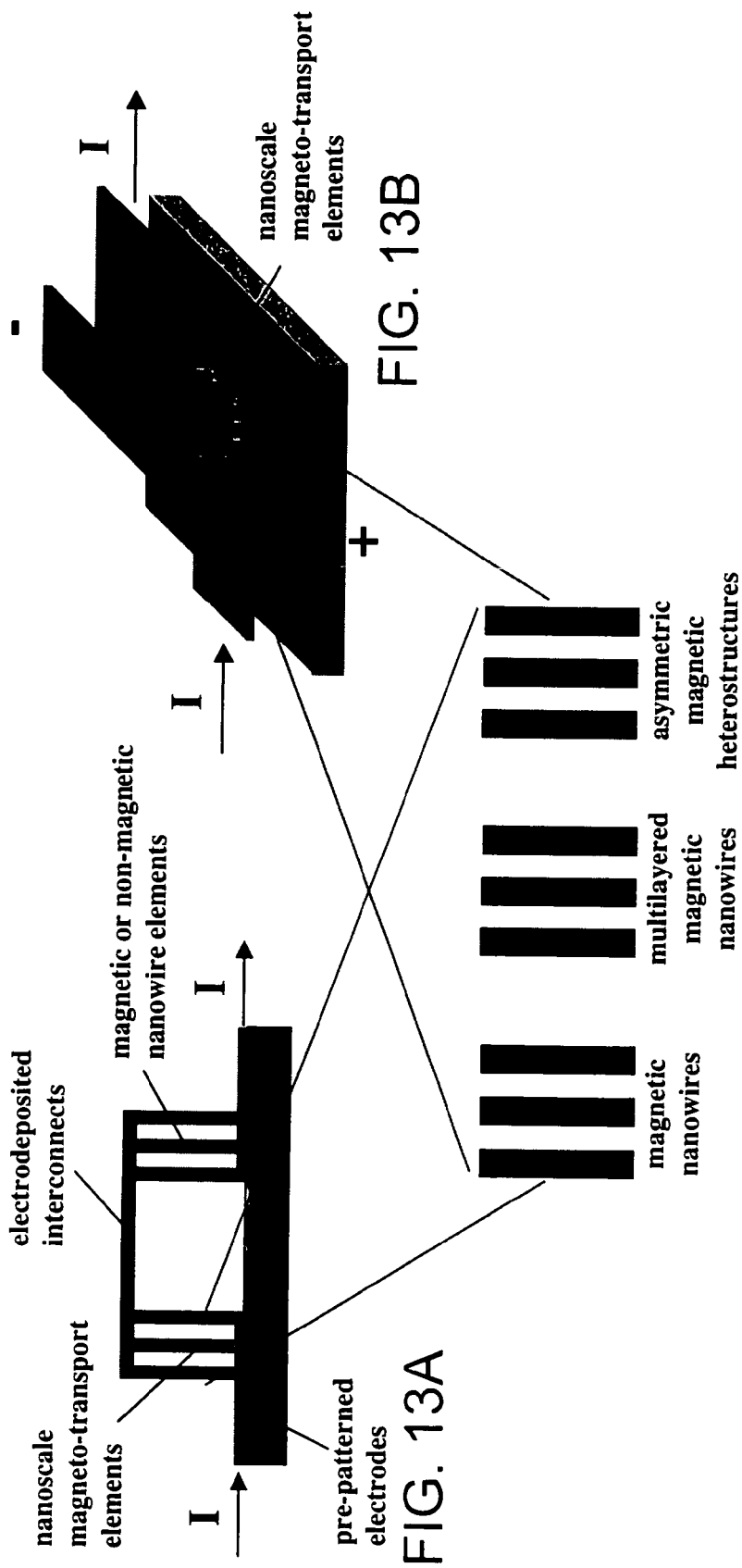

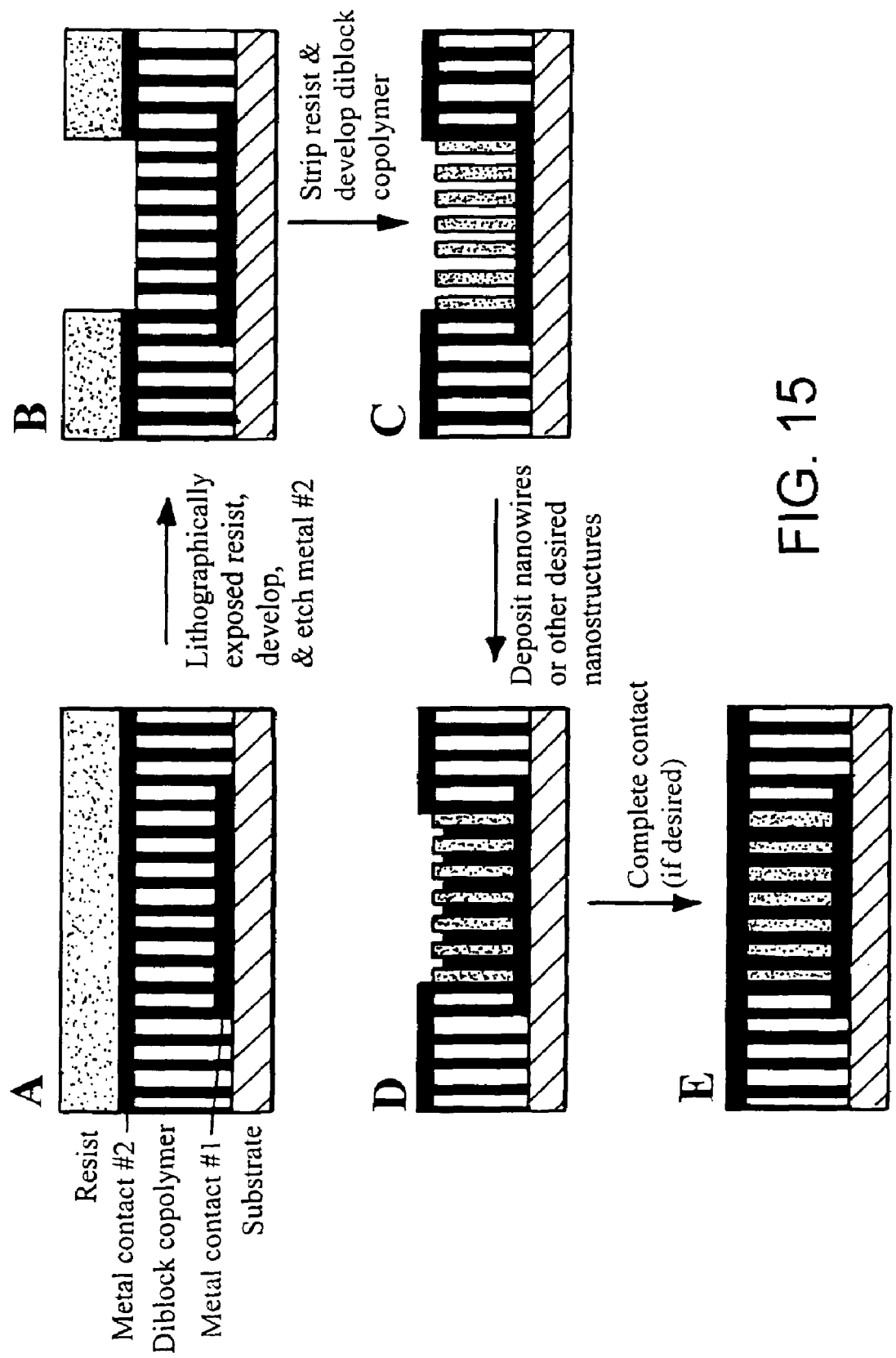

Fig. 16a 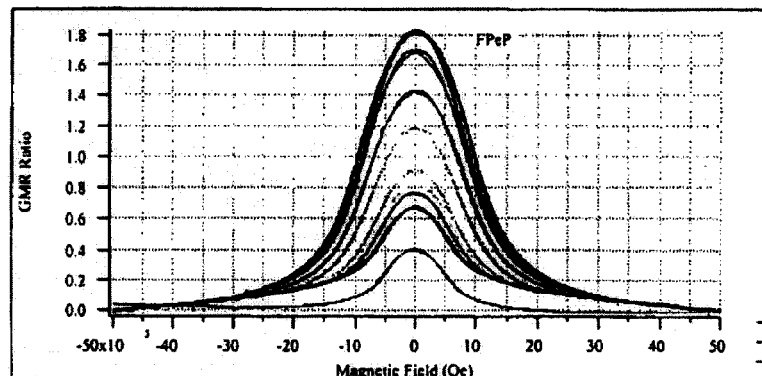 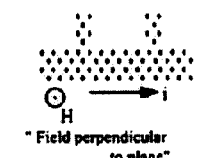
Fig. 16b 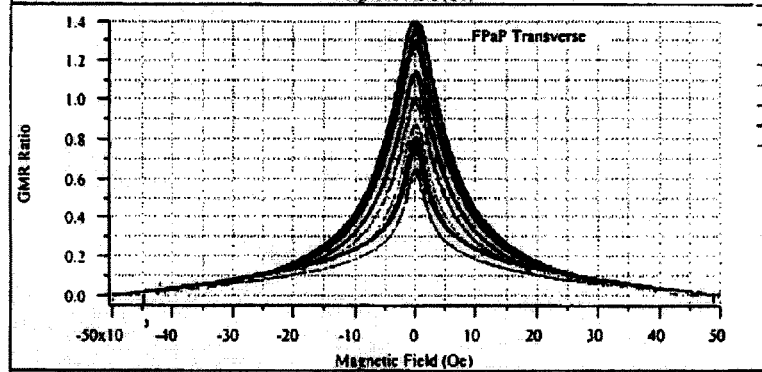 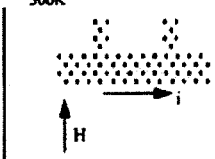
Fig. 16c 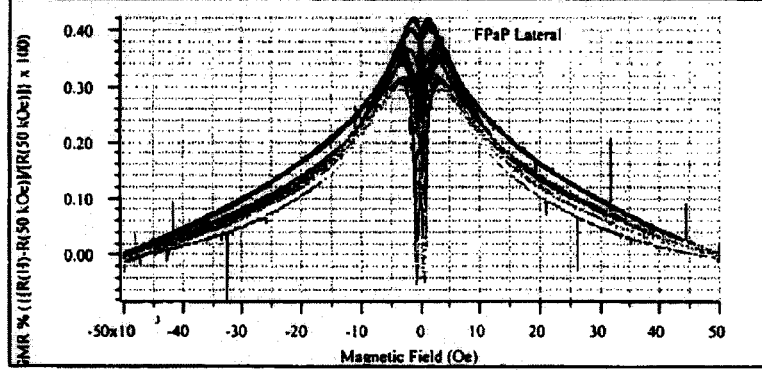 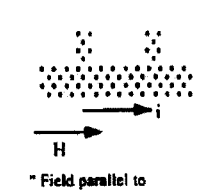

NANOFABRICATION

GOVERNMENT RIGHTS

This invention was made with government support under U.S. Department of Energy Grant No. DE-FG02-96ERA45612, U.S. National Science Foundation Grant No. DMR-9809365, and U.S. National Science Foundation Grant No. CTS-9871782. The government has certain rights in this invention.

TECHNICAL FIELD

The invention relates to fabrication of nanoscopic structures. In particular, the invention relates to functionalized nanoscopic structures on surfaces.

BACKGROUND

The fabrication of useful nanoscale devices has proved difficult. Approaches based on porous aluminum oxide (Anopore™), ion-track-etched polycarbonate (Nuclepore™), ion-track-etched mica, and other approaches, have been attempted. Examples of these are disclosed by Mitchell et al., in "Template-Synthesized Nanomaterials in Electrochemistry", *Electroanalytical Chemistry*, A. J. Bard and I. Rubinstein, Eds., 21, (1999), 1–74; Strijkers et al., in "Structure and Magnetization of Arrays of Electrodeposited Co Wires in Anodic Alumina," *J. App. Phys.*, 86, (1999), 5141; Han et al., in "Preparation of Noble Metal Nanowires Using Hexagonal Mesoporous Silica SBA-15," *Chem. Mater.*, 12, (2000), 2068–2069; Whitney et al., in "Fabrication and Magnetic Properties of Arrays of Metallic Nanowires," *Science*, 261, (1993), 1316; and in U.S. Pat. No. 6,185,961 for "Nanopost arrays and process for making same," to Tonucci et al.; and U.S. Pat. No. 6,187,165 for "Arrays of semi-metallic bismuth nanowires and fabrication techniques therefor," to Chien et al. These approaches result in materials which can be very difficult or impossible to pattern laterally and/or integrate. Other devices which can be prepared are macroscopic in scale, as disclosed in U.S. Pat. No. 6,187,164 for a "Method for creating and testing a combinatorial array employing individually addressable electrodes," to Warren et al.

Recently, companies such as Samsung and Hitachi have used carbon nanotubes as field emission sources to make prototype field emission (FE) displays. FE devices based on carbon nanotube materials are disclosed in "Flat panel display prototype using gated carbon nanotube field emitters," by Wang et al., *App. Phys. Lett.*, 78, (2001) 1294, and can provide acceptable field emission, but can be difficult to fabricate.

Serial writing processes can be used to pattern magnetic media, as disclosed in "Writing and reading perpendicular magnetic recording media patterned by a focused ion beam," by Lohau et al., *App. Phys. Lett.*, 78, (2001), 990, and "Magnetic block array for patterned magnetic media" by Koike, et al., *App. Phys. Lett.*, 78, (2001), 784. Researchers at IBM Almaden Research Center have utilized a fabrication scheme that resulted in patterned media having storage density of 100 Gb/in$^2$, as described in Lohau et al. This scheme used a focused Ga$^+$ ion beam to cut trenches in granular $Co_{70}Cr_{18}Pt_{12}$ film media. These processes tend to be slow, and are not well suited to high throughput manufacture.

The efficiency of thermoelectric (TE) cooling devices has not increased significantly during the last 40 years, and currently, the figure-of-merit (ZT) of the best materials is less than one. Semimetal materials such as Bi and $Bi_2Te_3$ have the highest ZT values and are currently used in commercial TE devices manufactured by companies such as Marlow and Melcor.

SUMMARY

By laterally patterning nanoscale arrays, a pathway to a rapid and reliable fabrication of three-dimensional nanostructures is provided. A simple method is described herein for the production of well-ordered, multilevel nanostructures. This is accomplished by patterning block copolymer templates with selective exposure to a radiation source. The resulting multi-scale lithographic template can be treated with post-fabrication steps to produce multilevel, three-dimensional, integrated nanoscale media, devices, and systems.

In one aspect, the invention provides a method of preparing a laterally patterned array. The method includes coating some of conducting or semiconducting substrate (for example, a metal, such as gold) with a block copolymer film (for example, a block copolymer of methylmethacrylate and styrene), where one component of the copolymer forms nanoscopic cylinders in a matrix of another component of the copolymer; placing a conducting layer on top of the copolymer to form a composite structure; vertically orienting the composite structure; removing some of the first component from some of the structure to form nanoscopic pores in that region of the second component; cross-linking the second component; and at least partially filling some of the nanoscopic pores with a material. The substrate can include conducting and non-conducting regions, which can be lithographically patterned. In such cases, a first component can be removed from some of the structure which is at least partially overlaying a conducting portion of the substrate. The structure can be vertically oriented by heating with an electric field, for example, for at least one hour. Some of the first component can be removed by exposing some of the structure to ultraviolet radiation, an electron beam, or ozone. Some of the first component can be removed by degrading the component and treating some of the structure with an agent that selectively removes the degraded component. Some of the nanoscopic pores can be filled by electrochemical deposition. Some of the nanoscopic pores and surface of the second component can be wetted with a surfactant prior to filling with material. Electrical current can be controlled to determine the amount of material deposited in the pores.

In another aspect, the invention provides an array manufactured by the methods described herein. The array can include a substrate, a polymer film on the substrate, and at least one set of parallel metallic (for example, gold, copper or nickel) or semi-metallic cylinders in the film, and arranged perpendicular to the substrate. The cylinders can include a magnetic material, such as cobalt or nickel. The magnetic arrays can be used to make a magnetic storage medium, or a magnetoresistance device, or a giant magnetoresistive device. Non-magnetic metals can be used in such arrays to make, for example, a field emission device. In some embodiments of these arrays, at least one set of cylinders includes n-type material and at least another set of cylinders includes p-type material. Such an array can be used to create a thermoelectric cooler. The cylinders can also include alternating layers of magnetic and non-magnetic material, whether the layers alternate substantially regularly along the length of the cylinders or not. In such arrays, the sets of cylinders can be configured in substantially regular geometrical shapes, such as circles or triangles. Of course, irregular shapes can also find application in the devices disclosed herein. In some of the arrays, one type of cylinder has a given magnetization direction, and another type has an opposite magentization direction. In some embodiments, at least one set of cylinders is in electrical contact with another set of cylinders, for example, by a conductive contact on top of the film.

As used herein, the term "vertically-oriented," when referring to a copolymer film means a film that has cylindrical pores with the axis of the pores substantially normal to the surface with which the film is associated, or substantially normal to the film surface itself. The new materials can have cylindrical pores that are vertically oriented, or oriented at an angle to vertical, as long as the cylinders are oriented in substantially the same direction, e.g., in parallel. These cylinders can have various shapes and can, but need not, have a circular diameter cross-section.

As used herein, the term "nanoscale" refers to a characteristic size range, for example, of arrays, that is attained using the methods of self-assembly of copolymer molecules described herein. For example, the pore diameter, the wire diameter, the wire lengths and the period of the array can be in the nanoscale range, that is, within a range of about a nanometer to over a thousand nanometers. As used herein the term "nanowire" refers to nanoscale material created in an array pore. The term does not imply that the aspect ratio of the material need be high, and in some embodiments, the material to be deposited in an array can have a low aspect ratio. "Nanowires" can also refer to material that is not necessarily electrically conductive, but is nevertheless useful when present in nanoscale arrays.

As used herein, the term "multilevel" refers to structures that can be constructed by multiple, independent levels of lithography, with at least one level created with a laterally-patterned diblock copolymer film. As used herein, the term "multilayering" refers to a structural element within a single layer of lithography that contains more than one material. As used herein, the term "wire" refers to conductive material having width and length, where the aspect ratio (that is the ratio of length to width) is at least 2:1. This term is distinguishable from the term "dot," which refers to conductive material with lower aspect ratios.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The techniques and systems described herein include many advantages. For example, the extremely high density of the magnetic cylinders in the new films offers the capability of using this system for next-generation magnetic data storage applications, with potential data storage densities in excess of 1000 Gbit/in 2. The well-controlled size and separation distance of the magnetic metals on the metal, e.g., gold, film also offer the means to engineer next-generation giant-magnetoresistance magnetic-field-sensing devices.

The processes are parallel, scaleable, and not subject to the speed limitations experienced in nanofabrication techniques based on serial writing. The techniques are amenable to manufacture, in that they are simple, fast, and cost-effective. They are readily adoptable by industry and compatible with other fabrication processes.

The techniques described herein significantly advance the general utility of nanofabrication by self-assembling copolymer templates. The nanofabrication techniques are amenable to manufacture, in that they are simple, fast, and cost-effective. They are readily adoptable by industry and compatible with other industrial microfabrication processes. For example, lateral patterning offers the capability of using such systems for the manufacture of electronic circuits on chips. The integration of nanostructures within chips and the interfacing of the structures with other chip elements in arbitrary locations is made possible through the methods disclosed herein.

For example, these three-dimensional structures offer the means to engineer electronic field-emission arrays. The arrays can be used in flat panel displays that are brighter, higher-resolution, less expensive, thinner, and more flexible than those currently available. Other field emission electron devices are possible, such as transistor-like devices, spin-polarized electron emitters, and other known devices based on field emission.

For example, the three-dimensional structures also offer the means to engineer solid-state thermoelectric cooling devices, including those with multistage cooling. Other applications include magnetoresistive sensors, high-capacity magnetic data storage, smart media, spintronics, chemical-sensing devices, biomolecular diagnostic sensor arrays, designer "micromagnetic" media, and molecular electronics, for example.

Other features and advantages of the invention will be apparent from the following detailed description, and from the claims.

BRIEF DESCRIPTION OF THE DRAWINGS

FIG. 13a is a side view schematic diagram of a particular configuration of a magneto-electronic transport nanodevice created from laterally patterned diblock copolymer film, where the "current in" and "current out" electrodes are both on the substrate level.

FIG. 13b is a perspective view schematic diagram of a further particular configuration of a magneto-electronic transport nanodevice created from laterally patterned diblock copolymer film, where the "current in" electrode is on the substrate level, and the "current out" electrode is on an upper interconnect level.

FIG. 13c is a side view schematic diagram of three distinct types of magneto-electronic nanoelements used in the devices of FIGS. 13a and 13b.

FIGS. 15a–e is a schematic depiction of a method of interfacing metal electrodes with the button and top of nanostructures made by a nanoscale diblock copolymer template.

FIGS. 16a–c is a series of graphs of magnetoresistance measurements for the device depicted in FIG. 11b, taken a various magnetic field orientations.

DETAILED DESCRIPTION

Figure 1:
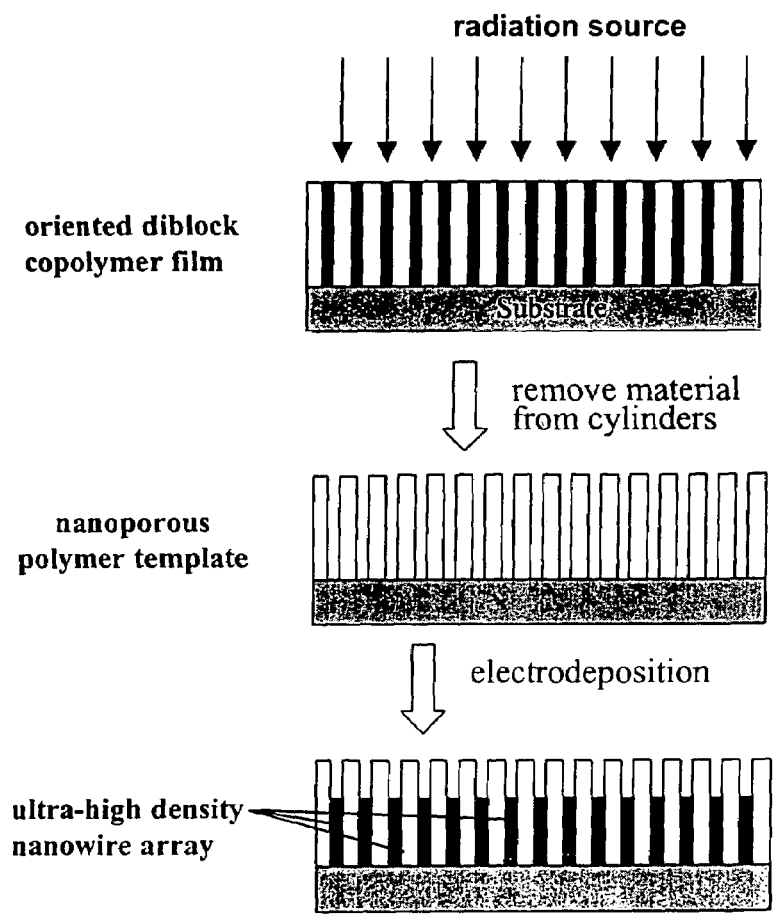
FIG. 1 is a schematic diagram of an exposure process that can be used to create a nanoporous array, and subsequently can be used to create an array of nanowires.

Described herein is a process technology for the fabrication of three-dimensional devices using laterally-patterned block copolymer templates. In this method, copolymer films are patterned laterally by selective-area exposure to radiation sources. This produces a multi-scale lithographic template, that is, a regular array of nanoscale pores with an overall lateral extent confined to an arbitrary and desired design. The dimensions of the lateral design can range from the nanoscale to the microscale. The patterned array template is combined with appropriately tailored pre- and post-fabrication steps to produce multilevel, three-dimensional integrated nanoscale media, devices, and systems. The method introduces the ability to integrate nanoscale functional elements in arbitrary and desired locations on a chip and to integrate the functional elements with other chip components in a practical manner. The general utility of self-assembled copolymer templates is thereby significantly advanced.

General Preparative Technique

The methods described here are based on the formation of regular arrays of material on surfaces. For example, diblock copolymers, comprised of two chemically distinct polymers covalently linked end-to-end, can be self-assembled into well-ordered arrays of spheres, cylinders or lamellae, depending on the volume fraction of the components comprising the polymer chain. Directed self assembly, carried out with an external field (for example an electric or magnetic field, or a temperature or concentration gradient), can result in useful films, with orientation sufficiently long-ranged to allow the production of extended arrays of nanowires having aspect ratios of at least 2:1 or 3:1. Vertically-oriented, cylindrical phase diblock copolymer films are created. Among many suitable diblock copolymers that can be use, a 70/30 (by volume fraction) polystyrene-polymethylmethacrylate diblock copolymer can be exemplified. Other cylinder constituents of the copolymer can be, for example, polybutadienes, polycaprolactones, and other materials that can be solubilized in solvents. Other matrix constituents can include polybutadienes and other materials which are not reactive with agents used to remove the cylinder constituents.

A block copolymer is first deposited, e.g., spun-cast from solution onto a substrate, such as a metallic, semiconducting, or insulating substrate. The substrate can be rigid or flexible. Of particular interest are: substrates at least partially coated with a thin film of metal; semiconducting substrates; and semiconducting substrates at least partially coated with a lithographically-designed thin film metal electrode pattern. Suitable substrates include: silicon, such as silicon wafers or chips; and polymeric substrates, such as Kapon, each of which can be made conducting or semiconducting by coating at least a portion of the substrate surface with a conducting or semiconducting material. Among metal substrates, for particular applications, the oxidation of the metal should not be as rapid as the deposition rate of materials to be deposited.

For example, substrates for use in the devices and techniques described herein may be a coating or a non-continuous surface layer on an underlying material that need not be conducting. The amount of substrate used can be any amount that allows the substrate to function as an electrode, when electrodeposition is used to deposit functional material. If other methods of material deposition are employed, the nature and amount of substrate is not limited. The substrate, in embodiments in which it is present as a coating or surface layer, can be applied to an underlying substrate by conventional lithographic techniques, or other known methods of depositing conducting materials on surfaces.

In some embodiments, the substrate can include metals, for example, gold. In other embodiments, the substrate can have gold coated or deposited on an underlying material. In some embodiments, the substrate can be a semi-metal oxide, including for example, silicon oxide. Particular preparation methods are not required, although in some embodiments, washing the substrate with water, followed by rinsing with mild acid and/or base can be carried out.

Diblock copolymers, comprised of two chemically distinct polymers covalently linked end-to-end, can be self-assembled into well-ordered arrays of spheres, cylinders or lamellae, depending on the volume fraction of the components comprising the polymer chain. If the volume fraction of a major component is about 0.7 (e.g., from about 0.65 to about 0.80), any copolymer will self-assemble into a hexagonal array of cylinders of the minor component embedded in a matrix of the major component. The mole ratio of the minor component of the diblock copolymer can range from about 0.20 to about 0.35 to permit the formation of microphases such as will result in cylinder formation. If the volume fraction of the major component is about 0.9, the minor component will form spheres, which can be elongated into very thin cylinders when an orienting field, e.g., an electric field, is applied.

A mixture of diblock copolymers, such as A-B and A-C diblock copolymers, can be used to create cylinders of different types, for example B and C cylinders. Higher block copolymers, such as A-B-C triblock copolymers can also be used. The molecular weight of the copolymer can be varied to achieve differing cylinder diameters. For example, a molecular weight copolymer in the range of about 1.5 million molecular weight units (Daltons) can result in a cylinder diameter of about 70 nm. A molecular weight in the range of about 20,000 Daltons can result in a cylinder diameter of about 14 nm. A molecular weight of about 4 million Daltons results in cylinders with a diameter of about 100 nm, while a molecular weight of about 15 kilodaltons results in a diameter of about 1.0 nm.

For some embodiments, the use of a block copolymer including a component that can be crosslinked is desirable. This component can be crosslinked before or during removal of another component, and can therefore add structural integrity to the copolymer. This component can be referred to as the matrix component. In some embodiments, the matrix component will be the major component of a copolymer, by volume. Suitable matrix components include polystyrene, polybutadiene, polydimethylsiloxane, and other polymers. The component that is to be removed can be called the core component. In some embodiments, the core component will be a minor component of a copolymer, by volume. Suitable core components include polymethylmethacrylate, polybutadiene, polycaprolactone or a photoresist. Generally, core components are materials that can be degraded or decomposed differentially than the matrix material.

In other embodiments, block copolymers of styrene and methylmethacrylate can be used. In some embodiments, the methylmethacrylate block constitutes a minor component. For example, a $70/30$ (by volume) diblock copolymer of polystyrene/polymethylmethacrylate can be employed. Any block copolymers can be used, such as alkyl/alkyl, alkyl/aryl, aryl/aryl, hydrophilic/hydrophilic, hydrophilic/hydrophobic, hydrophobic/hydrophobic, positively or negatively charged/positively or negatively charged, uncharged/positively or negatively charged, or uncharged/uncharged. The film thickness can vary as desired, for example, from about 0.5 nm to about 10 cm, or from about 1 nm to about 1 cm, or from about 5 nm to about 1000 nm. In some preferred embodiments, film thicknesses can vary from between about 10 nm to about 200 microns, or from about 1 micron to 200 microns, or up to about 25 mil.

Orientation of the copolymers can be carried out using directed self-assembly, that is, self-assembly which is directed by an external field, for example an electric field, a magnetic field, a thermal gradient or a concentration gradient. Vertical orientation of the cylinders can be accomplished by, for example, electric field alignment under annealing conditions, or, for example, self-orientation using controlled interfacial conditions.

For electric field-induced orientation, the different chemical constitutions of the blocks of the copolymer can result in a difference in the dielectric constants of the copolymer domains. A difference of about 0.1% in the dielectric constants can result in a specific, e.g., vertical, orientation. In an electric field, the orientation dependent polarization energy associated with the cylinders, dielectric bodies that are anisotropic in shape, will align the cylinders in parallel to the electric field lines, for example, as described in Morkved, et al., "Local control of microdomain orientation in diblock copolymer thin films with electric fields," Science, 273, (1996), 931; Thurn-Albrecht, et al., "Overcoming Interfacial Interactions with Electric Fields," Macromolecules, 33, (2000) 3250–53; Amundson, et al., "Alignment of lamellar block-copolymer microstructure in an electric-field. 1. Alignment kinetics," Macromolecules 26, (1993), 2698; and Amundson, et al., "Alignment of lamellar block-copolymer microstructure in an electric-field. 2. Mechanisms of alignment," Macromolecules 27, (1994), 6559.

Under strong enough fields parallel to the substrate, any surface induced alignment of the morphology can be overcome, producing cylindrical microdomains oriented in parallel with the fields, which can be normal to the substrate, that extend completely through a one-micron-thick sample. Scattering experiments are an easy means to characterize the orientation of the microphase structure in a thin film. When viewed from the side, a cylindrical structure oriented normal to the substrate is laterally periodic. Consequently, the scattering pattern measured at a finite incidence angle is strongly anisotropic, consisting of two equatorial Bragg peaks.

In some embodiments employing an electrical field to orient the polymer film, a removable conducting layer is placed on top of the copolymer film, sandwiching the film between two electrodes. For example, a conducting layer can be deposited by spin coating and then, after annealing, be removed by etching, e.g., by solvent chemical, or physical etching. Alternatively, a "spin-on" sacrificial layer can be applied, followed by a metal layer that is evaporated, sputtered, or spun-on. After annealing, the sacrificial layer can be removed by solvent, chemical, or physical etching. This conducting layer can be metal, or semiconducting material, and can optionally be in contact with the entire film surface. For example, aluminum, copper, gold or other metal can be used as the conducting layer on the copolymer film.

Metallized layers, such as aluminized KAPTON® can also be used. Metallized layers can promote the formation of a uniform film surface as orientation, e.g., vertical orientation, is carried out. For example, in some embodiments, the use of a metal conducting layer alone, in direct contact with the copolymer film, can result in damage to the copolymer layer as the conducting layer is removed, due to sticking and/or tearing. Aluminized Kapton® is a layer of aluminum in register with a layer of Kapton®, in which the Kapton® layer is directly in contact with the copolymer film. The Kapton® layer must not be so thick as to interfere with an electric field established between the aluminum layer and the substrate on the other side of the film. Other metals and other polymeric materials can be used to create metallized layers for electric field-induced vertical orientation.

To mobilize the molecules in the copolymer, the sandwich structure can be heated above the glass transition temperature of the copolymer. Voltage is then applied between the substrate and the conducting layer to create an electric field through the mobilized copolymer film. The electric field strengths are at least 5 V/mm, for example, at least 10 V/mm. After holding the film in this state for a sufficient time to allow the copolymers to self-assemble, for example, over 30 minutes, over 60 minutes, over 1.5, over 2, or over 3 hours, the copolymer film assembly is cooled to a temperature below the glass transition temperature of the copolymer. The orienting field, e.g., electric field, is desirably turned off after the cooling has taken place. At this point the conducting layer, and any associated additional layer, is removed from the polymer film. The film now includes an ordered array of cylinders of one copolymer component embedded in a matrix of another copolymer component. Self-assembly results in parallel orientation of the blocks, such that one component forms cylinders with the cylinder axis substantially in parallel to each other, e.g., all normal to the surface of the substrate, or substantially normal to the film surface itself. The cylinders desirably extend substantially from the substrate surface to the surface of the film. The cylinders have diameters ranging from about 5 nm to about 100 nm. The periodicity (L) of the cylindrical domains in the film is the distance between the central axes of the cylinders, and is proportional to the molecular weight of the copolymer (to the ⅔ power). In embodiments in which the mole fraction of the minor component is from 0.2 to 0.35, and the cylinders are hexagonally packed, the periodicity defines the diameter of the cylinders. Periodicity can range, for example, from about 1.0 to about 70 nm, but can be outside this range.

In other embodiments, methods other than heating are used to make the molecules of the copolymer mobile. For example, rather than heating the copolymer to its glass transition temperature, one can, in effect, lower the glass transition temperature, by any of a number of ways. For example, one can add a plasticizer, a solvent, or a supercritical fluid, such as supercritical $CO_2$, to the copolymer to mobilize the molecules and allow them to move and self-assemble. An orienting field is applied, and the plasticizer, solvent, or supercritical fluid is removed to immobilize the molecules. Thereafter, the orienting field is removed, but the immobilized molecules maintain their orientation.

Orientation using electric field allows a wide range of film thicknesses to be prepared, and thereby a wide range of nanowire aspect ratios to be produced. Nanowire aspect ratios can range, for example, from about 0.05:1 to about 10,000:1; or about 0.1:1 to about 5,000:1; or about 1:1 to about 500:1; or about 2:1 to about 10,000:1 or about 2:1 to about 5,000:1, or about 2:1 to about 500:1, or about 2:1 to about 100:1. Such large aspect ratio wires in an extended array are useful for creating sufficiently large magnetic coercivity though shape anisotropy, for example.

Orientation using controlled interfacial interaction is well suited for relatively thin diblock films. For example, less than about 100 nm, or less than about 60 nm, or less than about 40 nm thick. According to such methods, a substrate is pre-treated so that it presents a "neutral" surface to a copolymer diblock film. Hydrogen-passivated silicon, or silicon coated with a random-copolymer brush, are suitable exemplary neutral surfaces. Thin diblock films can be spun-cast atop this surface and annealed. The cylinders will self-orient vertically without directed self assembly from an external field in sufficiently thin diblock films, for example, films of less than about 100 nm.

Such methods result in a very flat film surface and simplify manufacture, since the application and subsequent removal of a top electrode are not strictly required. Ultrahigh density magnetic data storage can be achieved if magnetic materials having larger intrinsic anisotropies than cobalt are used. (FePt for example.) High pattern resolution on thin films is possible using an electron beam for lateral patterning.

The surface of the copolymer film obtained after orientation can be used as formed for a number of applications. For some applications, the surface of the vertically oriented copolymer film is desirably substantially smooth. Such arrays and techniques for producing substantially flat surfaces are described in U.S. Provisional Patent Application Ser. No. 60/191,340, filed Mar. 22, 2000, titled "Magnetic Arrays;" and U.S.patent application Ser. No. 09/814,891, filed Mar. 22, 2001, titled "Nanocylinder Arrays," and each application is incorporated herein by reference in its entirety. For example, for magnetic data storage applications, in which a reading device passes rapidly over a magnetic array, the surface is desirably smooth. Any application in which a read or write head passes over an array can require high smoothness. Smoothness of a magnetic array for data storage and retrieval applications desirably ranges from about 0.5 to about 5.0 nm. The surfaces of vertically oriented copolymer films can be made smooth with the use of an additional material, such as an elastomer or a crosslinked elastomer applied to the conducting layer before vertical orientation steps are undertaken. For example, an additional material, such as a crosslinked silicone, including crosslinked-polydialkylsiloxanes, -polydiarylsiloxanes, or -polyalkyl-arylsiloxanes, including, for example, crosslinked-polydimethylsiloxane, can be applied to a conducting layer, or in some embodiments, to an additional layer, as described above. The conducting layer, and/or any associated additional layer, is coated with the additional elastomeric material, and the layers placed in contact with the copolymer film. Vertical orientation is carried out, as described above, and the layers removed from the surface of the vertically oriented copolymer film. The surface can be made thereby smoother than surfaces created without the additional elastomeric material.

Next, the minor component (or in some embodiments the major component) of the substrate-associated copolymer is removed (either component of a diblock copolymer can be "minor" or "major," and the components can also be equally present). Removal of the minor component is achieved, e.g., by exposure to radiation (ultraviolet light, x-ray radiation, gamma radiation, visible light, heat, or an electron beam or any other radiation source which selectively degrades the minor component). Degradation or decomposing agents such as reactive oxygen species, including for example, ozone, or solvents such as ethanol, can also be used. Ultraviolet light can be used to degrade, for example, polymethylmethacrylate as a core component. Ethanol can be used to degrade, for example, polybutadiene.

This treatment can be followed by a chemical rinse to remove the decomposition byproduct, and typically results in porous material having pore sizes in the tens of nanometer range. A step to remove any residual component can include treatment with a liquid, including washing with a solvent, or a material that reacts preferentially with the residual component, such as an acid or a base. In some embodiments, the material used to react with residual degraded component can be, for example, a dilute form of acetic acid. The volume formerly filled by a now removed copolymer component now comprises cylindrical spaces extending through the thickness of the film. The remaining volume is occupied by the remainder copolymer component and is referred to as the matrix.

In some embodiments, it may be desirable to optionally cross-link a component of the copolymer film. Cross-linking of a component that is not degraded by an energy source or agent can add structural strength to the film. In some embodiments, a copolymer component is crosslinked simultaneously with the degradation of another copolymer component. The radiation can optionally and desirably crosslink and substantially immobilize the matrix component of the diblock copolymer, so that the matrix maintains the array structure even after the cylindrical voids are created. A nanoporous array template is the resulting overall structure. For example, in the case of polymethylmethacrylate (PMMA) cylinders in a polystyrene (PS) matrix, ultraviolet radiation degrades the PMMA while crosslinking the PS. It is desirable that the initial morphology of the copolymer be retained throughout the entire process of degradation. Other methods of removing one or the other component (e.g., chemical methods) can be used. Either the "minor" or "major" component can be removed or be remaining. The dimensions of the pores generally are the same as those of the cylindrical domains of the vertically oriented copolymer film, and as such, the pore diameters can range from about 5 nm to about 100 nm or more, and the periodicity can range from about 5.0 to 70 nm.

Subsequently, the resulting pores are at least partially filled with, for example, metallic, metalloid, semiconductor, and/or magnetic materials. Deposition of functional material can be carried out by, for example, electrodeposition, chemical vapor deposition, electroless deposition, surface chemistry, chemical adsorption, and chemically driven layer-by-layer deposition. For deposition of material in pores that have depths of more than about 30 nm, electrodeposition is a desirable method, since it provides a driving force for the deposition of material into the bottoms of the pores. For example electrodeposition within the pores of a nanoscale template derived from films of diblock copolymers provides a convenient means of filling the large aspect-ratio pores in a highly controlled manner to provide an array of nanowires.

For those applications relying on magnetic properties of the array, the nanowires include at least some magnetic material. Magnetic materials include cobalt, nickel, iron, and alloys which contain one or more of these materials, and includes those materials which are measurably magnetic. For those applications relying on magnetic properties of the array, the nanowires include at least some magnetic material. Magnetic materials are those materials that are measurably magnetic, and can include magnetic metals, such as cobalt, nickel, iron, rare-earth magnetic materials, and alloys that contain one or more of these materials (such as iron-platinum alloys, or PERMALLOY®, an alloy of iron and nickel, with a stoichiometry of $Ni_{81}Fe_{19}$), as well as magnetic non-metals, including ceramic materials such as strontium or barium in combination with iron oxide. Organic magnets, such as tetracyanoethylene, can also be employed as magnetic materials. Magnetic systems can also contain materials that are non-magnetic, including non-magnetic metals, such as copper, gold, silver, and the like.

Magnetic materials can also be prepared as magnetic nanowires by deposition of alternating layers of magnetic metals and non-magnetic materials. Such alternating layers can be optionally and, for some embodiments desirably, regularly alternating, and the regularity can include regularly alternating amounts of such materials. For example, a magnetic nanowire can include at least three layers of material alternating as: magnetic metal, non-magnetic material, magnetic metal; or non-magnetic material, magnetic metal, non-magnetic material. The alternating layers can be optionally, and in some embodiments desirably, non-regularly alternating. More details are given in "Magnetic Multilayers and Giant Magnetoresistance: Fundamentals and Industrial Applications (Springer Series in Surface Sciences, No 37)," Uwe Hartmann (editor), 370 pages, (Springer-Verlag, 2000), which is incorporated herein by reference. Cobalt/copper alternating multilayers have been found to be useful.

Magnetic materials can be generally chosen to have a selected magnetic coercivity, which will depend on the desired application. For example, by using just cobalt (Co) nanowires, the coercivity can range from about 7000 Oe, to any lower number. Under appropriate fabrication conditions, the perpendicular coercivity of a cobalt nanowire array can exceed 1.7 kOe at 300K, due to the cylindrical shape anisotropy and nanowires having diameters smaller than the size of a single magnetic domain. The coercivity can be tuned to smaller values by selecting specific electrodeposition conditions, pore diameter, and additives. For example, using the techniques described herein (applied field perpendicular to the substrate and parallel to wire axis), one can establish perpendicular coercivity of about 800 Oe at room temperature. Higher coercivities can be obtained by depositing rare earth magnetic materials.

Magnetic materials can also have their magnetoresistive behavior tuned by adjusting the thickness of the magnetic sections, the thickness of the normal metal sections, and the diameter of the multilayered nanowires. These devices are so-called "giant" magnetoresistive devices, which are sensitive magnetic field sensors, in that the resistance changes dramatically with a change in magnetic field. One can also intentionally make "two-state" devices using non-regular multilayering. For example, a thick magnetic layer, followed by a thin normal metal layer, and then followed by a thin magnetic layer can be deposited in nanowires to form an array useful to design a two-state device.

In other embodiments, one can reverse the magnetization state of the smaller magnetic layer by increasing the current through the device. A spin-polarized electron current leaves the larger magnetic region and is injected into the smaller magnet. This current exerts a torque on the magnetization in the smaller magnet and can reverse the direction of magnetization. The change in magnetization is typically accompanied by a discrete change in measured resistance. This results in a way to "write and read" using current. One can "write" with a larger current, and "read" with a smaller current. These concepts are discussed in Katine et al., "Current-driven magnetization reversal and spin-wave excitations in Co/Cu/Co pillars," *Phys. Rev. Lett.*, 84, (2000), 3149. Optimal electrodeposition of magnetic material can involve the alignment of the magnetic axis of the material normal to the surface upon which the magnetic material is deposited.

For those applications which do not rely on magnetic properties of arrays, any other material which can be electrodeposited can be employed, including metals generally, semimetals (including, for example, Bi and BiTe), and certain semiconducting materials that can be electrodeposited. Optimal electrodeposition of magnetic material can involve the alignment of the magnetic axis of the material substantially, parallel or skew normal to the surface upon which the magnetic material is deposited.

The technique described above is generally depicted in FIG. 1, which shows an oriented diblock copolymer film on a substrate. The dark areas on the substrate represent one of the components of the diblock copolymer, and the adjacent lighter areas represent the other component of the diblock copolymer. The upper surface of the copolymer film is here shown perfectly flat. This condition can be preferable for some applications, although this is not a requirement for the technique generally. Those applications which desirably involve the production of substantially flat film surfaces can utilize methods which use a further polymer on top of the copolymer film. For example, polydimethylsiloxane can be deposited across the surface of the copolymer film to produce a substantially flat surface on the copolymer film.

For particular applications, the matrix material is desirably removed from the substrate surface after deposition of functional material. In other applications, the matrix material is desirably present subsequent to deposition to provide structural stability to the array of nanowires, or to allow further post-fabrication lithographic steps. Removal of matrix material can be achieved by treating the array with an agent that selectively degrades the matrix material with respect to the nanowires as described above.

Selective Exposure

The methods of certain embodiments described herein are based on the selective exposure of the diblock copolymer template to a radiation source which removes material from the polymer film, to create three-dimensional nanoscale elements in a multilevel integrative technology. Special multilevel processing steps, specifically tailored to each particular device configuration, are used to achieve the complex integration. A simple product may require patterned diblock level of lithography only, while a complex integrated product may also require pre- and post-fabrication lithographic steps. The common technique to all cases of nanostructure fabrication is the selective copolymer patterning technique.

Figure 2B:
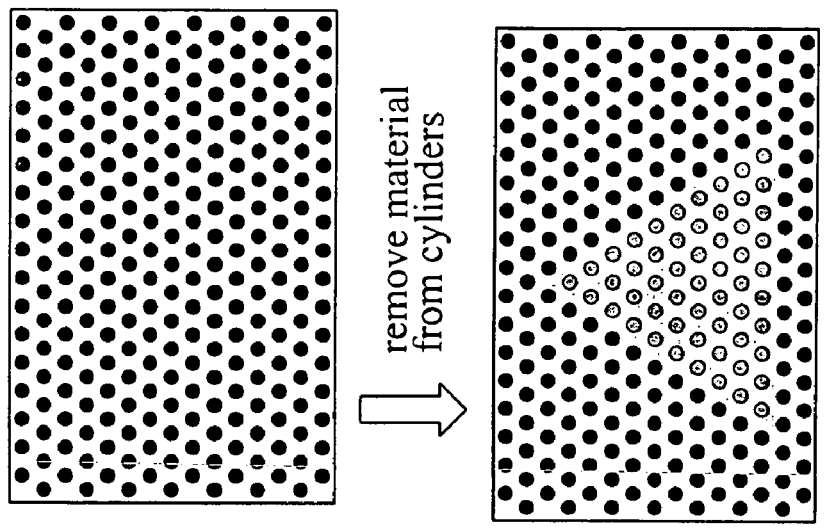
FIG. 2b is an overhead view schematic diagram of a selective exposure process that can be used to create a laterally patterned diblock copolymer film, in this case, a triangle pattern.
Figure 2A:
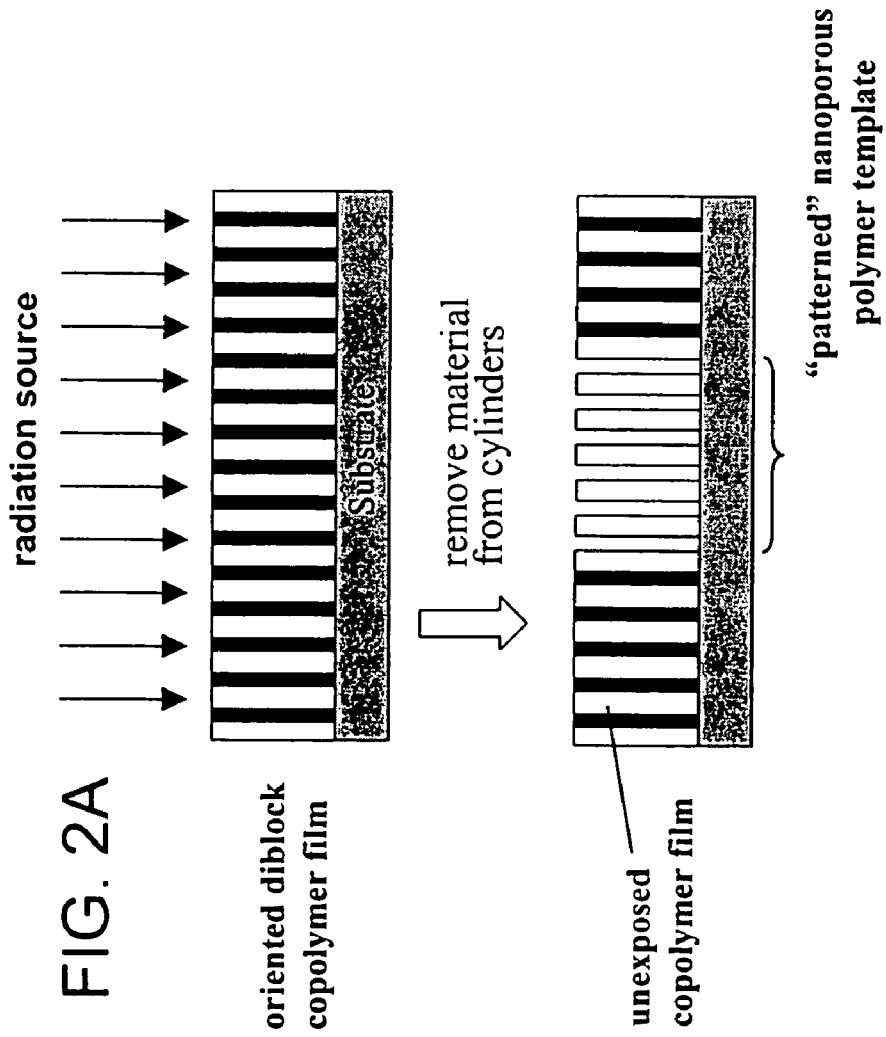
FIG. 2a is a side view schematic diagram of a selective exposure process that can be used to create a laterally patterned diblock copolymer film.
Figure 3:
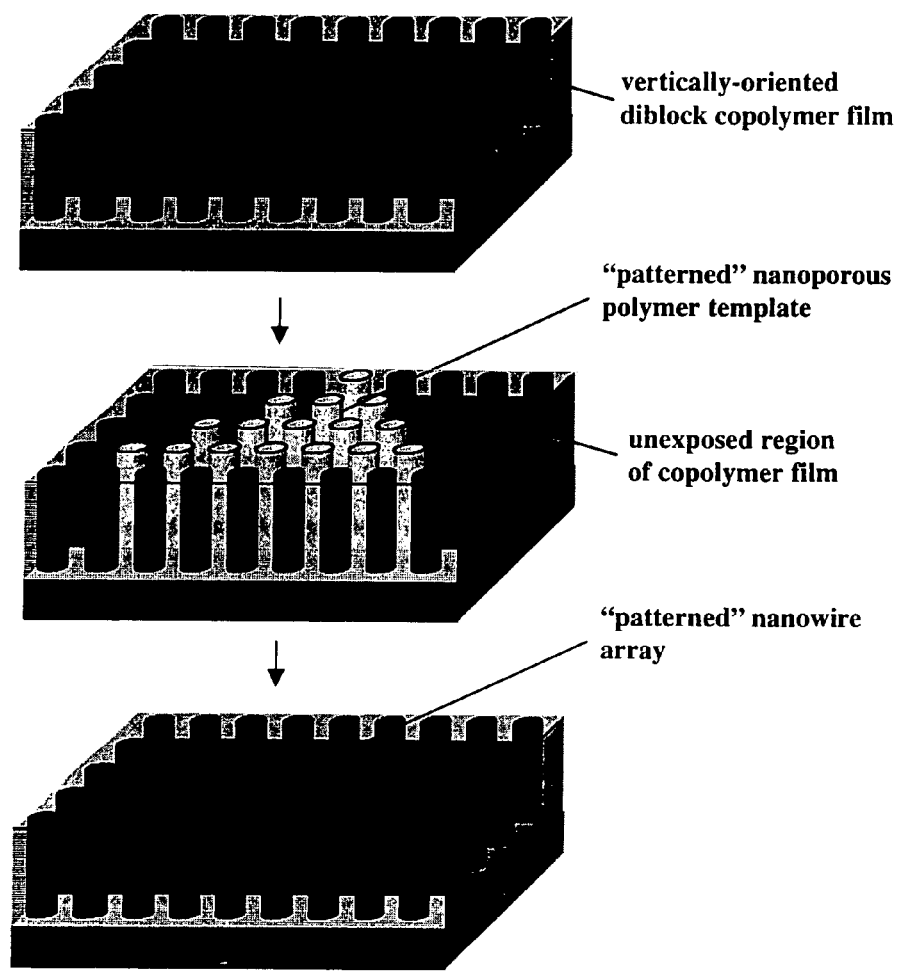
FIG. 3 is a schematic diagram of a selective exposure process that can be used to create a laterally patterned diblock copolymer film, and subsequently can be used to create a laterally patterned nanostructure, in this case, a triangle shaped nanostructure.

The process involves the selective alteration of specific areas or location of a nanoporous copolymer template, e.g., by exposure to a radiation source. Suitable radiation sources for the selective degradation of a copolymer component include, for example, ultraviolet (UV) light, electron beams, or other sources of radiation that can efficiently degrade a component of a diblock copolymer. The process is depicted generally in FIG. 2a, which shows a side view of a vertically oriented diblock copolymer film on a surface, with radiation impinging on the copolymer film. The radiation removes material from the film to create cylinders, and since the exposure is selective, there are areas of the film that contain cylinders, and areas which do not. FIG. 2b is an overhead view of the same film, showing explicitly that, in this case, a triangular shape has been imposed on the film surface, resulting in an area where electrodeposition can potentially be carried out, depending on the characteristics of the underlying surface. FIG. 3 depicts the same process and resulting template, with the matrix component of the film deleted in FIG. 3 for clarity.

For applications involving the use of UV light, a UV mask or UV projection can be used for spatial selectivity across the surface of the array. For applications involving electron beams, a focused electron beam writer or other electron beam source can be used for spatial selectivity. The exposure pattern imposed on the surface can be related to, or dictated by, underlying features in the film or on an underlying surface, or can be unrelated to such features. For example, when the underlying surface includes an electrode pattern, specific alignment of portions of the diblock exposure pattern with portions of the electrode pattern can be a requirement for device manufacture. The resulting array is referred to as being laterally patterned.

Once a patterned nanoporous array template is created, surface-selective materials deposition methods can be used to locate desired materials into the pores to create nanoscale elements. Nanowires will be present only in areas which are the union of areas exposed to radiation, and areas containing an electrode underlying the surface of the copolymer film.

Novel use of electrochemical deposition methods, for example, enables several applications. Other surface-selective materials deposition techniques can be used, including chemical vapor deposition, electroless deposition, surface chemistry, chemical adsorption, and chemically driven layer-by-layer deposition, for example. In the case of electrochemical deposition, different electrodes can be held at differing voltages during the electrochemical deposition to allow or prevent deposition at chosen electrodes, and this technique can be referred to as "programmed deposition." Specifically, since the underlying electrodes are separately addressable, one electrode (or group of electrodes) can be held at a potential appropriate for deposition of one material, while other electrodes are held at potentials which do not allow depositions of that material. This method offers expanded materials versatility, in that different types of nanowires can be deposited on the same chip.

Figure 4:
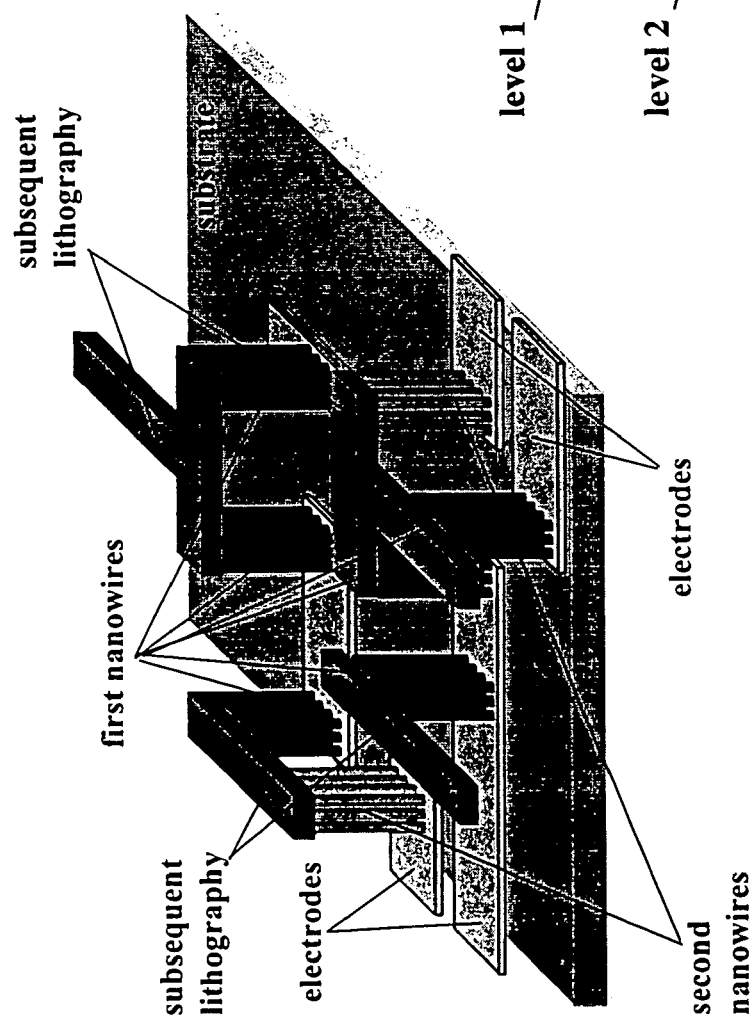
FIG. 4 is a perspective view schematic diagram of a multilevel nanostructure created from laterally patterned diblock copolymer film.

An example of this type of nanofabrication is depicted in FIG. 4, which is a schematic diagram of a multilevel structure created using the concepts described above. In FIG. 4, the matrix component of the copolymer is deleted from view for clarity. The substrate includes thin film electrodes in, or on, its surface, which can be created by conventional lithography, for example. Lateral patterning can be carried out in registry with the underlying electrode pattern as desired, followed by electrodeposition of a first material, results in the creation of first nanowires, as shown. Subsequent electrodeposition of a second material, at an electrode potential different from that used for the electrodeposition of the first material results in the creation of second nanowires, as shown. First and second materials can differ in characteristics, particularly in characteristics which are relevant to the functional aspects of the devices. The first and second materials can be metals or semi-metals, so that characteristics, such as reduction potential, semi-metal type (for example, "n"- or "p"-type semi-metal, metalloid or semiconducting materials), reduction potential, and other useful characteristics can be varied in different locations of the film.

Figure 5:
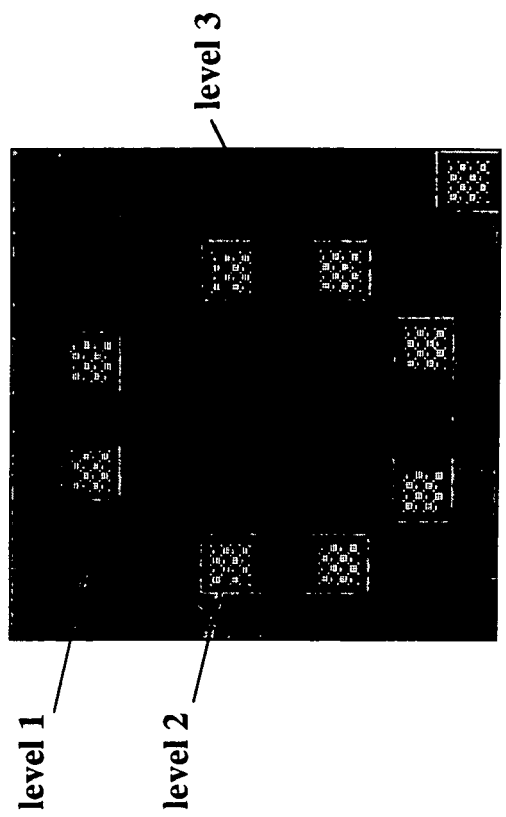
FIG. 5 is an overhead view schematic diagram of a multilevel nanostructure created from laterally patterned diblock copolymer film.

Alternatively, lateral patterning, followed by electrodeposition of a first material creates first nanowires as shown. Another lateral patterning step, in a different location, followed by electrodeposition of a second material, at any electrode potential, results in the creation of second nanowires. Subsequent lithography, also known as electrodeposited post-level connections, on the surface of the film creates connections between sets of nanowires, and allows the creation of simple or complex circuits. FIG. 5 shows an overhead view of another example of such a three dimensional structure, emphasizing the relationship between electrical connections underlying (level #1), through (level #2), and overlying (level #3) the matrix component of the diblock copolymer to create electrical connections in registry with components on these differing levels.

In some applications, it is desirable to use subsequent upper levels of lithography for interconnection and integration purposes. Such embodiments are depicted in FIGS. 13a, and 13b, which show two basic configurations of magneto-electronic transport nanodevices. FIGS. 13a and 13b depict magneto-electronic device configurations that utilize transport current through the nanowires. These devices utilize anisotropic magnetoresistance, giant magnetoresistance, or spin-polarized current switching magnetoresistance, as discussed in Katine et al., "Current-driven magnetization reversal and spin-wave excitations in Co/Cu/Co pillars," *Phys. Rev. Lett.*, 84, (2000), 3149, for magnetic sensing and "spintronic" purposes. They are relevant to magnetic data storage read head technology, magnetic RAM, and magnetic sensing applications. FIG. 13a shows a first configuration, in which the "current in" and "current out" electrodes are on the substrate level, and the interconnection between these two electrodes is on the upper interconnect level. FIG. 13b shows a second configuration, in which the "current in" electrode is on the substrate level and the "current out" electrode is on the upper interconnect level. Particular combinations of these configurations will be readily apparent to those designing circuits.

Figure 17:
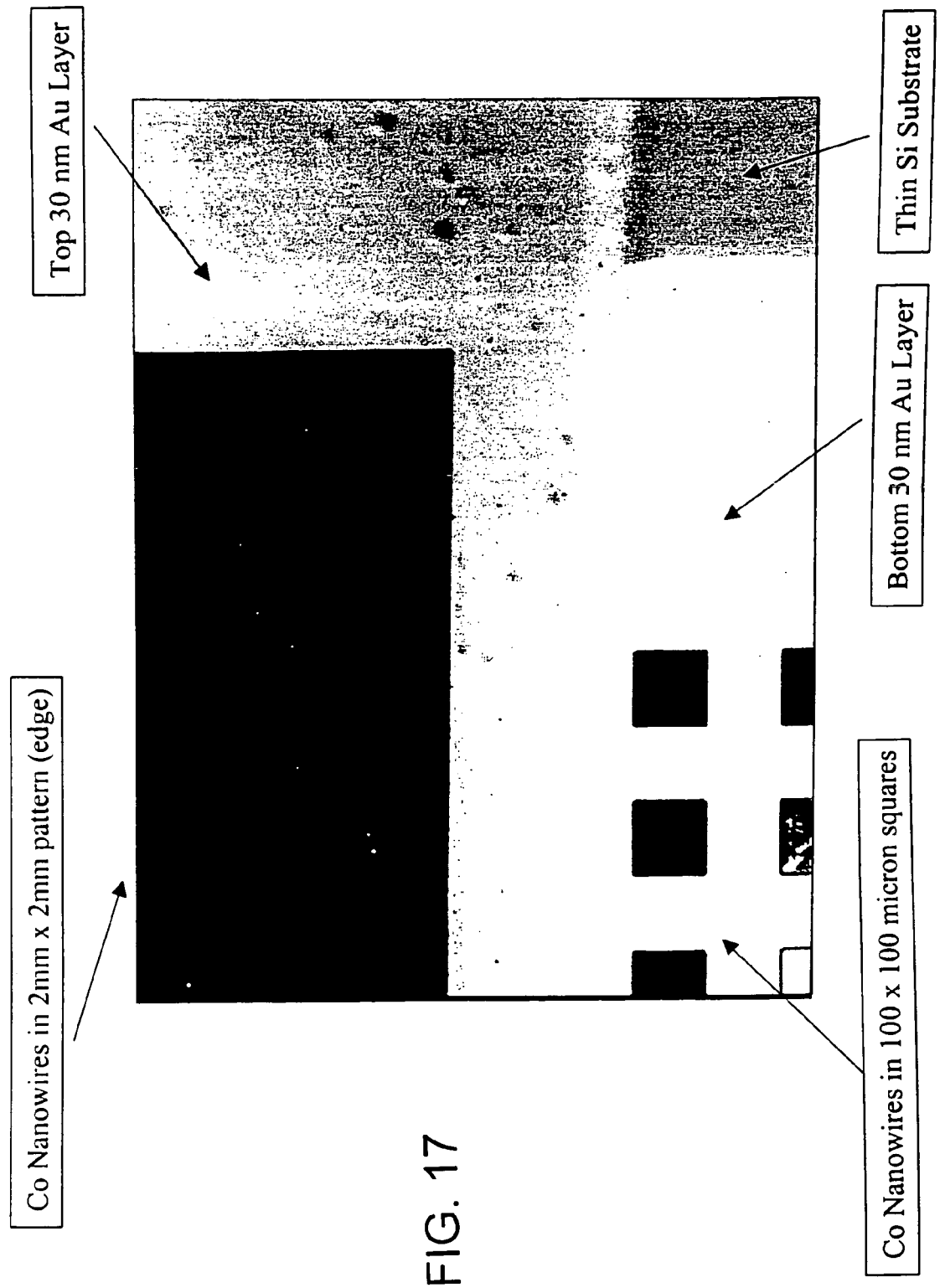
FIG. 17 is a microscope photograph of a device constructed as shown in FIG. 13.
Figure 18:
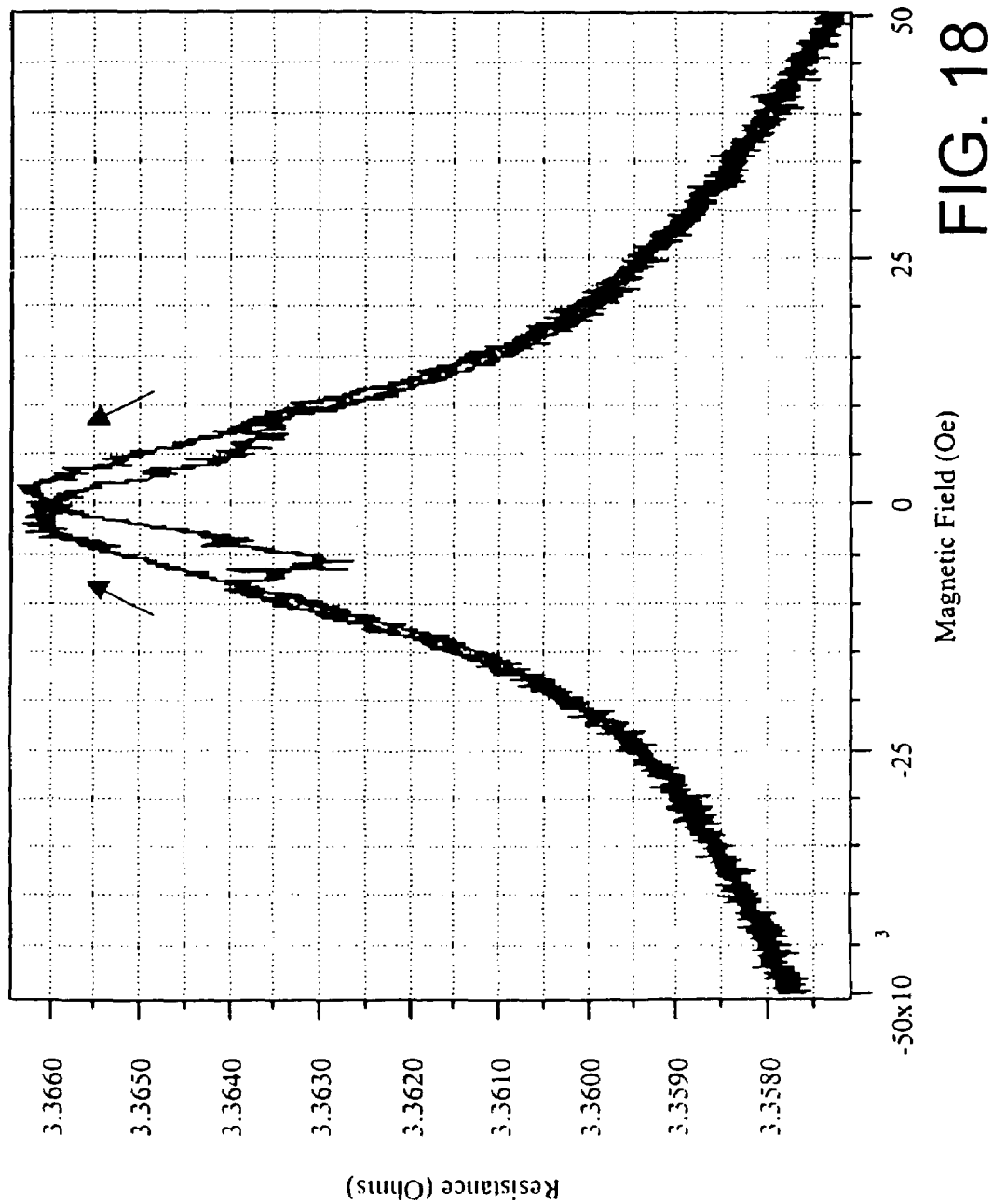
FIG. 18 is a graph of magnetoresistance measurement of electron transport through the device shown in FIG. 17.

A device of the construction depicted in FIG. 13 has been made, and a microscope photograph of this device is shown in FIG. 17. The patterned black regions are the locations of the nanowires. Magnetoresistance measurements of electron transport through the device depicted in FIG. 17 have been carried out, and are shown in FIG. 18.

In addition, the nanowires themselves can be multilayered, using pulsed electrodeposition in a two-component bath, for example, to create Cu/Co multilayers, or by sequential electrodeposition. Some embodiments of multilayered nanowires are depicted in FIG. 13c. Magnetic nanowires are, as discussed above, created using magnetic materials, principally including cobalt, nickel, iron, and alloys containing these metals, and are useful for anisotropic magnetoresistance applications. Multilayered magnetic nanowires are created using substantially regularly alternating layers of magnetic materials and non-magnetic materials within individual nanowires (for example, Co/Cu alternating layers), and are useful for giant magnetoresistance applications. Asmmetric magnetic heterostructures are made using substantially nonregularly alternating layers of magnetic and non-magnetic materials, useful for spin-polarized current switching magnetoresistance.

Immediately after the selective area exposure, the polymer film contains polymer in three distinct states: 1) the degradation by-products; 2) the insoluble component; and 3) the virgin, oriented diblock copolymer in the unexposed regions. The coexistence of these three states offers additional fabrication versatility. By choice of solvent or radiation, one can choose to remove only the exposed cylinders, or alternatively, the exposed cylinders and the unexposed regions of diblock copolymer. For example, acetic acid can be used to remove degraded polymer fragments from the exposed area, but will not affect the matrix component. An agent such as acetic acid will also not remove material from the virgin, unexposed diblock copolymer. If desired, the removal of material from virgin regions can be achieved by treatment with another agent, for example, toluene. If desired, the removal of the unexposed diblock copolymer can be chosen to occur at a separate stage of processing, for example, after nanowires have been fabricated in the pores.

It is also relevant to note that for high-dosage overexposures, both polymer blocks will crosslink, rendering a solid insoluble film that can also be used for fabrication purposes. In such embodiments, neither component of the diblock copolymer can be removed. Such areas can be used as robust barriers, which protect the underlying substrate from further solvent processing. The use of different combinations of exposure and solvent protocols greatly advance the general utility of the general procedures described herein for the fabrication of nanostructures.

Figure 14B:
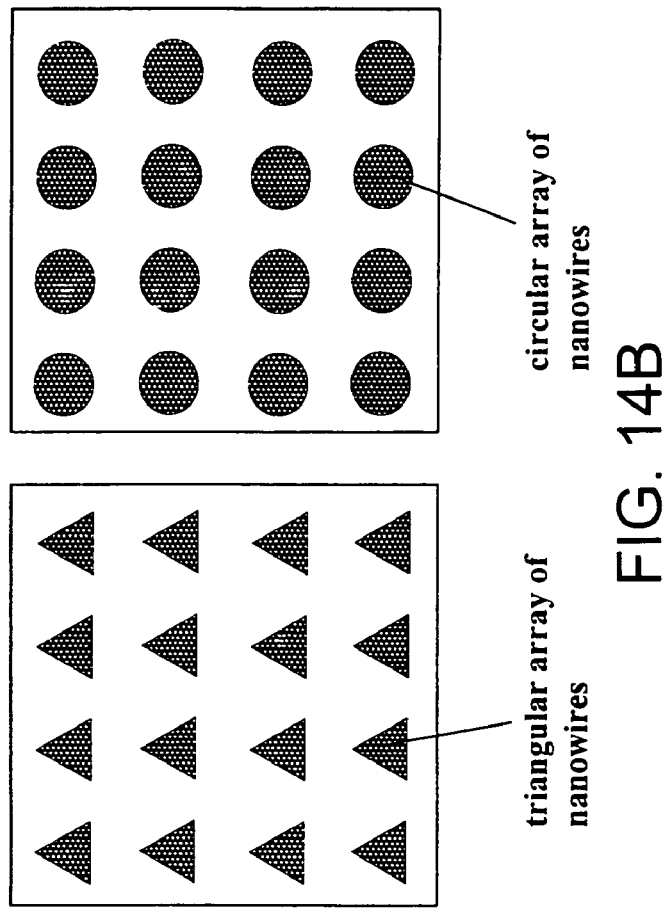
FIG. 14b is an overhead view schematic diagram of a further particular example of patterned media, showing customized patterned perpendicular media.
Figure 14A:
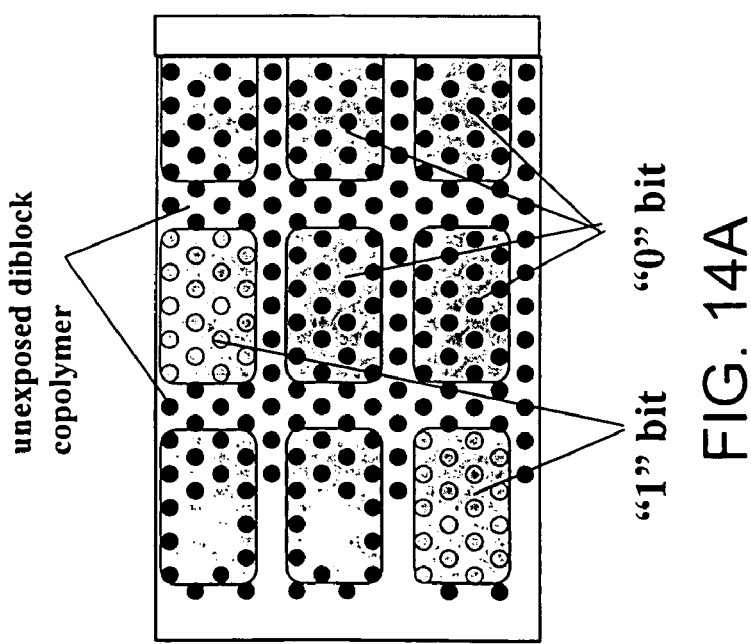
FIG. 14a is an overhead view schematic diagram of a particular example of patterned media, showing patterned perpendicular media.

In data storage applications, patterning of magnetic arrays can be used to create patterned perpendicular magnetic media, as shown in FIG. 14a. Each set of nanowires is separated from other sets of nanowires by unexposed diblock copolymer. All individual nanowires within a given set of nanowires have the same magnetization direction, either up or down, corresponding to a data bit of either "1" or "0."

In other applications in which the magnetic switching behavior of magnetic arrays can be exploited, the laterally patterned arrays described herein are of utility. The magnetization switching field of a magnetic nanowire can be modified substantially by the magnetic dipolar interactions it experiences due to neighboring nanowires, and consequently depends on whether the nanowire is found in a circle, triangle, cross- or star-shape, or other shape which tends to maximize or minimize the exposure of nanowires to each other or non-magnetic areas of the film. The lateral extent and shape of an array of magnetic nanowires will influence its switching behavior dramatically. This can be observed in the magnetic hysteresis curve (magnetization versus applied field) and in the magnetoresistance of a device using such wires. Using the patterned diblock templates we can create "designer micromagnetic media." This designer media can be used in magneto-transport device technologies that require discontinuous changes at specific threshold fields or for other applications that utilize stepwise changes in magnetic field. Some of such embodiments are exemplified in FIG. 14b, which show both triangular and circular sets of nanowires. The discontinuous switching behavior of designed devices can be enhanced for particular applications.

Applications

The three dimensional nanostructured arrays described herein can be used in of technologies, including: display technology, cooling technology, magneto-electronic technology, data storage technology, sensor technology, biomolecular array technology, molecular electronic technology, waveguide technology, and other technologies. The techniques presented here are general and provide advances to a variety of research materials systems.

Field Emission Applications

Field emission displays (FEDs) offer high brightness, low power consumption, and flat-panel design. The displays can include an addressable array of field emitters and a phosphorescent screen. Efficient field emission displays require high-aspect-ratio nanoscale metal tips (for example, from about 20:1, or about 35:1, or about 50:1 to about 10,000:1) to enable electronic field emission at low threshold voltages.

To achieve a sufficiently large current density, the emitters are desirably arranged into a high-density array. To define display pixels, the array is desirably patterned laterally into sets of nanowires, with each pixel electronically addressable. These sets can include from one to 10, 20, 30, or more nanowires, depending on the desired application.

The present invention offers simplified processing and the ability to make tip arrays with improved orientation.

The ultra-high density, laterally patterned arrays created by the methods described herein can be successfully used for high-resolution, low power, thin and flexible display devices. The high aspect ratio of nanowires created by the techniques described herein allow the threshold voltage for emission to be sufficiently low so that power consumption for such field emission devices is correspondingly lowered. The devices are useful for television and video screens, computer monitor screen, and many other display devices such as on watches, GPS devices, and any other devices currently using LED or LCD displays. The thinness of such field emission arrays allows the design of such devices to be far thinner than devices available currently. Display devices made with the technology described herein are also much brighter for a given level of energy consumption than those currently available. The possibility of using a flexible substrate further expands the utility of display devices made with the techniques described herein. Differing display applications will have differing priorities as regards operating characteristics; for example, an outdoor display can require high brightness, and a video display can require high resolution.

Figure 6:
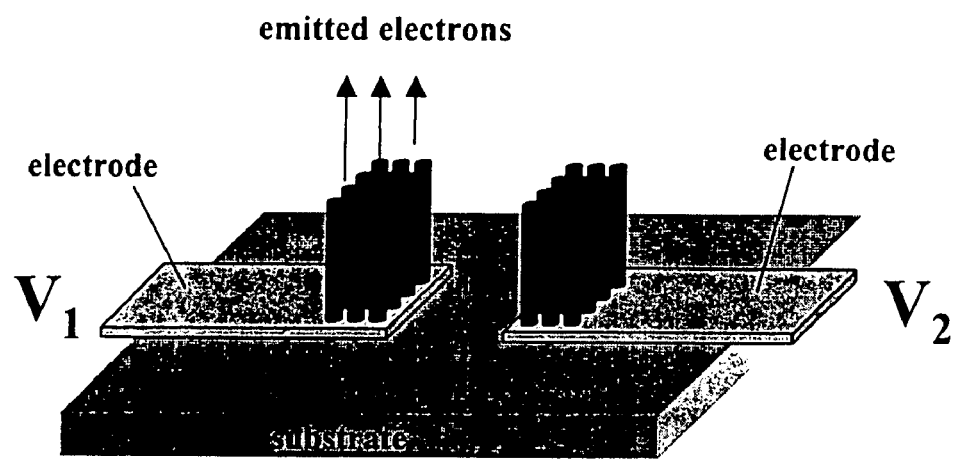
FIG. 6 is a perspective view schematic diagram of a field emission array created from laterally patterned diblock copolymer film, including two sets of nanowires.

An example of a field emission array created according to the methods described herein is shown in FIG. 6, which is a perspective view of a diagram of such an array. The substrate has electrodes in or on its surface, created by conventional lithography. Diblock copolymer is deposited on the substrate, as described above, for example, by spin-bonding. Vertical orientation, selective irradiation, chemical treatment, and electrodeposition follow to create sets of nanowires, in this case, deposited on two distinct electrodes. For field emission applications, the ends of the nanowires are desirably at or near the film surface. This can be achieved by either growing (that is, electrodepositing) the wires to substantially the full film thickness, or by growing them to a lesser extent (for example, 90% of the film thickness), followed by removal of a portion of the surface of the film, by means known to those of skill in the art (including, for example, reactive ion etching by oxygen plasma). Again, the matrix component is deleted from FIG. 6 for clarity.

Figure 19:
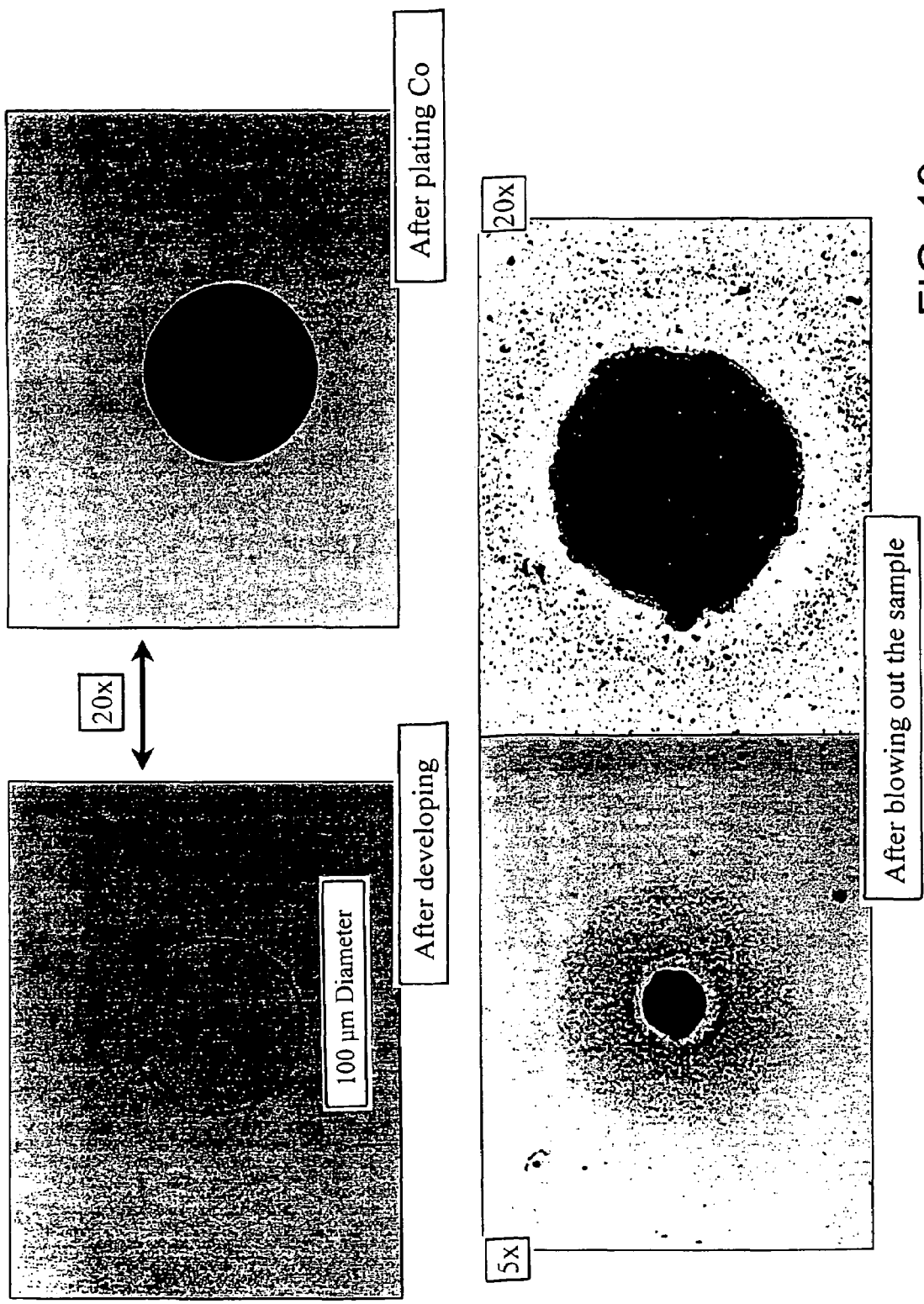
FIG. 19 is a microscope photograph of a field emission test sample from a device constructed as depicted in FIG. 6.
Figure 20:
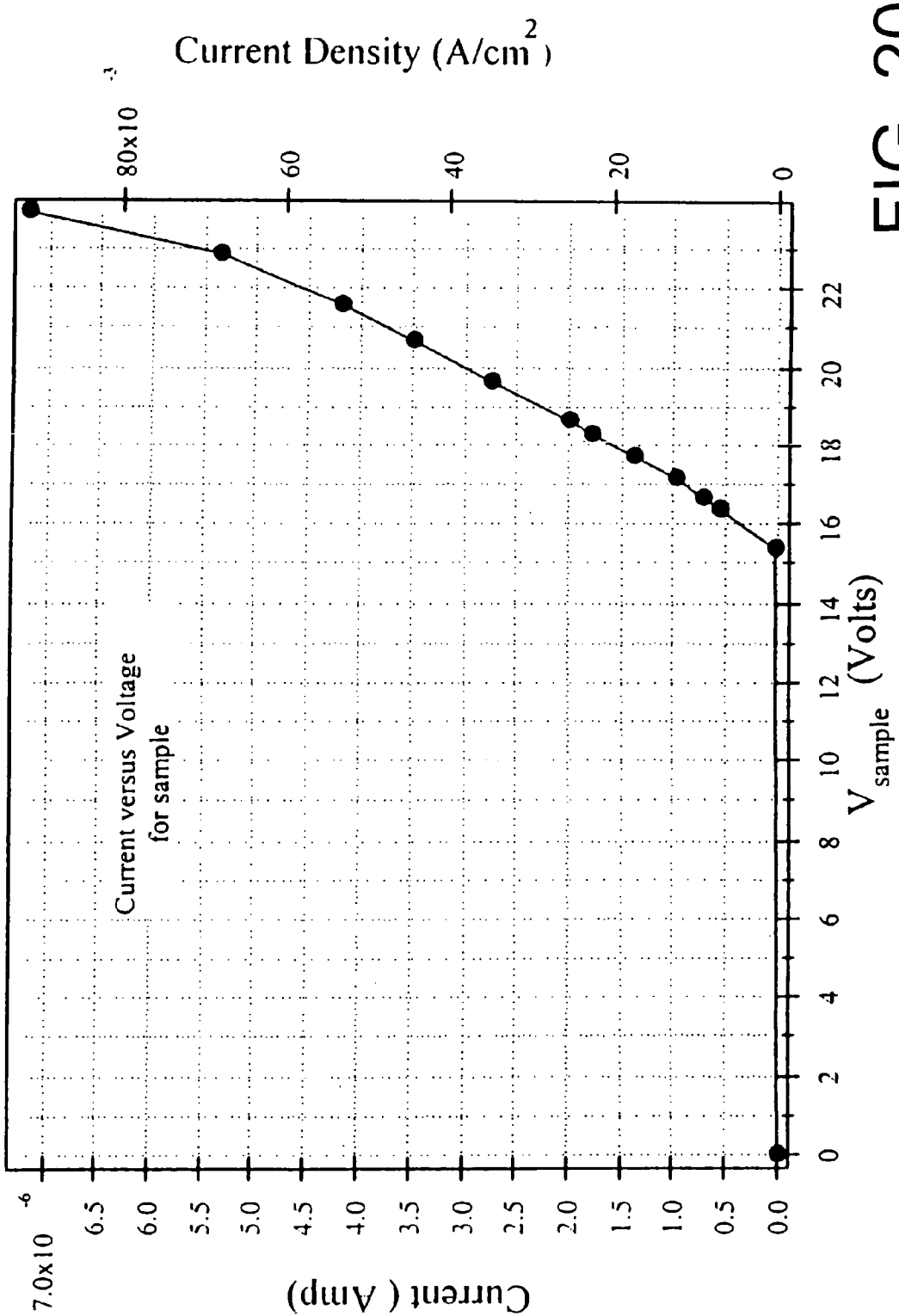
FIG. 20 is a graph of electronic field emission measurements made from an array of cobalt wires in vacuum, from the device shown in FIG. 19.
Figure 21:
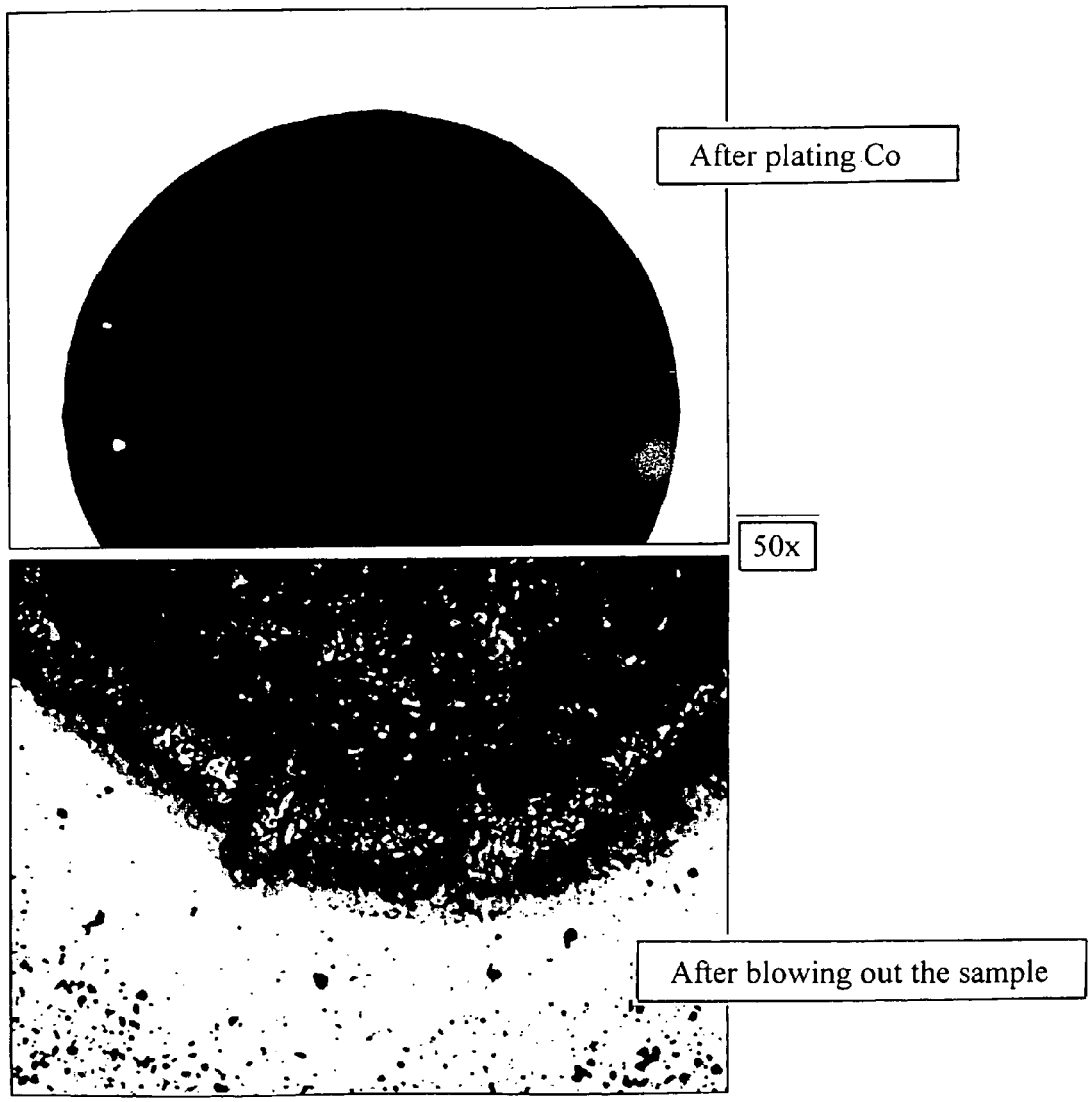
FIG. 21 is a microscope photograph of particular field emission test samples from FIG. 19, but magnified to 50×.

A device according to the construction of FIG. 6 was made, and microscope photographs of this device are shown in FIG. 19. The diblock template is shown patterned into a circular region at 20× magnification in the upper left of FIG. 19. The same region is shown after 250 nm cobalt nanowires have been grown at −1V into the circular region, but before electrical measurements were made at 20× magnification in the upper right of FIG. 19. The same region is shown after electrical measurements were made and then having brought up the emission current to the point at which the sample was destroyed in the lower part of FIG. 19 (lower left at 5× magnification, lower right at 20× magnification). FIG. 20 shows a graph of electronic field emission measurements made from the array shown in FIG. 19. A large current density and a low threshold was achieved. FIG. 21 is a close up of the images from FIG. 19, upper right and lower left, before and after destroying the sample, respectively.

Figure 7:
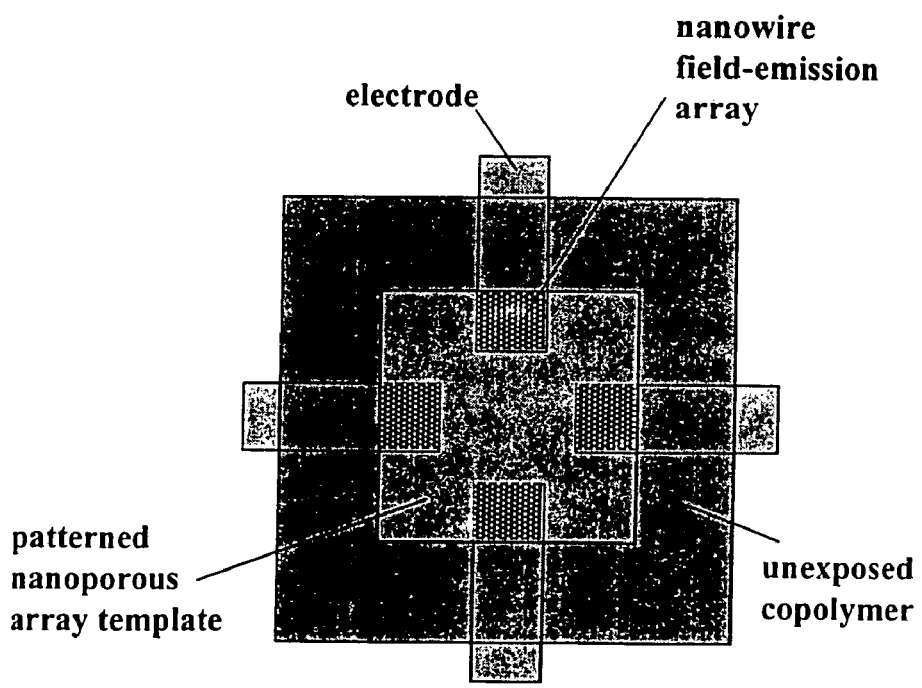
FIG. 7 is an overhead view schematic diagram of a field emission array created from laterally patterned diblock copolymer film, including four individually-addressable sets of nanowires.

The electrodes are individually addressable, in this case, with voltages $V_1$ and $V_2$. These applied voltages are independently varied as desired to control (that is, turn "on" and "off") the emission current from each nanowire set. A phosphor screen can be placed above the nanowire sets to create a display. FIG. 7 shows an overhead view of a similar device, but with four individually addressable sets of nanowires. It is important to note that nanowires are deposited only on the substrate where: 1) the copolymer is exposed to irradiation that degrades a component of the copolymer down to the substrate surface; 2) the residue of degraded component is removed from the substrate surface; and 3) the substrate surface has an electrical contact allowing electrodeposition.

Thermoelectric Cooling Applications

Solid-state cooling devices can also be designed utilizing the technology described herein. At present, the best commercially available thermoelectric cooling devices have thermoelectric figures of merit of approximately 0.1. The techniques described herein can produce devices which have thermoelectric figures of merit approaching or exceeding 2.0, e.g., devices having a figure of unit of 0.5, 0.7, 0.9, 1.0, 1.2, 1.5, 1.7, 1.8, 1.11, 2.0 or greater.

Figure 9:
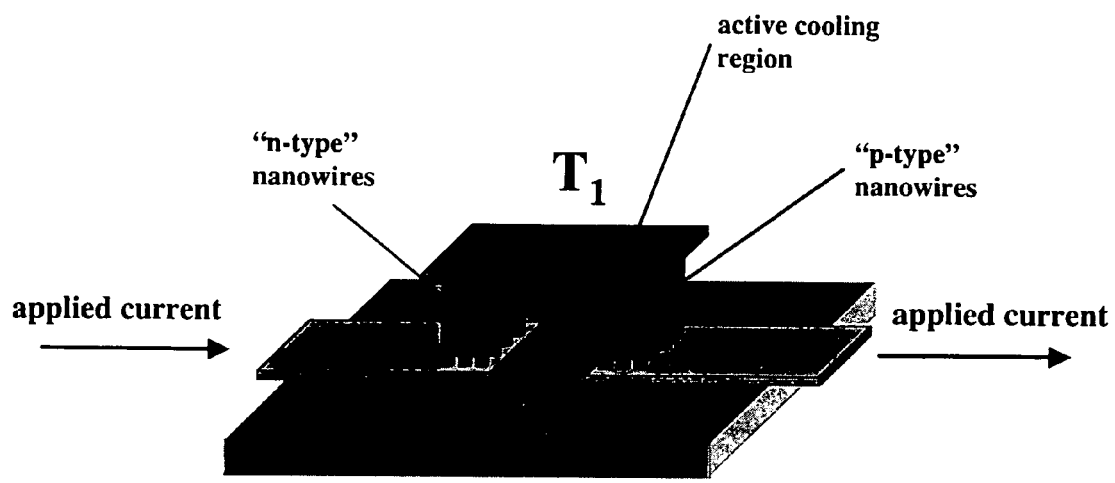
FIG. 9 is a perspective view schematic diagram of a single-stage thermoelectric cooler created from laterally patterned diblock copolymer film.

FIG. 9 is a diagram of a single-stage thermoelectric cooler which can be made according to the methods described herein. The substrate has electrodes pre-patterned in or on its surface. A patterned diblock copolymer layer is created on the substrate, as described herein. Again, the matrix component of the copolymer is deleted in FIG. 9 for clarity. Nanowires of two types are deposited by programmed electrodeposition. In the depicted example, "n-type" nanowires, made from "n-type" materials, well known in the art, are deposited at one electrode, and "p-type" nanowires, made from "p-type" materials, also well known in the art, are deposited at another electrode. A top-layer metal interconnect is then deposited electrochemically. The device operates through the application of current through the device, so that the top plate becomes cold and the electrodes and substrate become warm. The top plate can be used as a heat sink for use in electronic devices, for example. Multi-stage coolers can also be made by this fabrication method. Heating devices are also made possible by the simple adaptation of the device for such purposes.

Magnetic Data Storage Applications

Next generation magnetic data storage technologies will likely utilize perpendicular magnetic media to store data. Present technologies use lateral magnetic media in which the magnetic storage elements lie along the surface of the substrate. In the effort of packing more elements per unit area, the size of the basic elements must be reduced. This introduces a problem, however, since as the scale of these regions is reduced, so is the blocking temperature which marks the onset of superparamagnetism. The blocking temperature must be kept large, otherwise the stored magnetization state of each element will decay and data will be lost.

One way to reduce the size scale of a magnetic media element without substantially reducing the blocking temperature is to utilize shape and volume, that is, to make small cylindrically-shaped objects of high aspect ratio (for example, from about 20:1, or about 35:1 or about 50:1 to about 10,000:1). All other considerations being equal, a cylindrically-shaped magnet of diameter 10 nm and length of 500 nm will have a much higher blocking temperature than that of a spherical magnet of 10 nm diameter. The highest spatial packing density of magnetic cylinders occurs for cylinders in a vertical hexagonal closed-packed arrangement.

In the bulk, pure cobalt is a soft ferromagnet of relatively low coercivity and not necessarily an ideal material for magnetic data storage. However, certain cobalt alloys have "designer" magnetic properties including engineered coercivity which makes them useful for present-day magnetic media applications. These cobalt alloys can be electrodeposited from a specific plating bath containing the relevant ions.

The techniques described herein can be used to create arrays useful for the next generation of magnetic data storage. Since the surface smoothness of such arrays can be important, it is considered desirable to utilize an auxiliary polymer to produce highly smooth films on substrate surfaces. Highly smooth films can be created by depositing polydimethylsiloxane on a diblock copolymer film, as described in copending U.S. patent application Ser. No. 09/814,891, filed Mar. 22, 2001, titled "Nanocylinder Arrays." The application is incorporated herein by reference in its entirety.

Engineered Magnetoresistance Applications

Magneto-electronic devices can be used for magnetic sensing applications (e.g., magnetic data storage) and for "spintronics" (e.g., MRAM). Appropriately chosen nanoscale magnetic architectures can result in improved performance since magnetic interactions can be tuned at the nanometer scale. The techniques described herein can be used to create devices in a variety of useful magneto-electronic configurations.

Materials have been developed over the last ten years that are now used for magnetic sensing by utilizing their giant magnetoresistive (GMR) properties. These materials have various architectures, but in general are multilayered materials with layers of non-magnetic metals in contact with layers of magnetic metals. The magnetic interlayer-exchange-coupling and electron spin-dependent scattering lead to the sensitivity of resistance with respect to magnetic field. Tuning the structure of these systems by materials engineering allows magnetoresistive properties to be optimized for applications. GMR read heads in hard-disk drive technology is one important commercial application. These engineered materials systems are expected to advance with better materials and new material architectures.

The magnetic arrays made using techniques described herein show GMR type behavior. However, the architecture of these arrays is significantly different than others that have been produced. The important consideration for GMR device design is that there be electrical contact between the substrate and the magnetic nanowires, not whether the wires are embedded in the template or not. Therefore, the wires can be grown (that is, electrodeposited) to less than the film thickness for GMR devices without a need to remove matrix material prior to operability.

Of key importance to optimal performance of GMR devices is the ability to form a regular array of very small dimensions, for example, an array of 25.4 nanometer period made of cylinders 11 nanometers in diameter. Furthermore the fabrication processes described herein permit the well-controlled height of the cylinders, and the ability to multilayer the cylinder material as it is grown. These new processing considerations have allowed the creation of new geometrical architectures at size scales that have not been achieved using known fabrication processes. By tuning material structure in the fabrication processes described herein, a new breed of GMR materials is possible.

Figure 10:
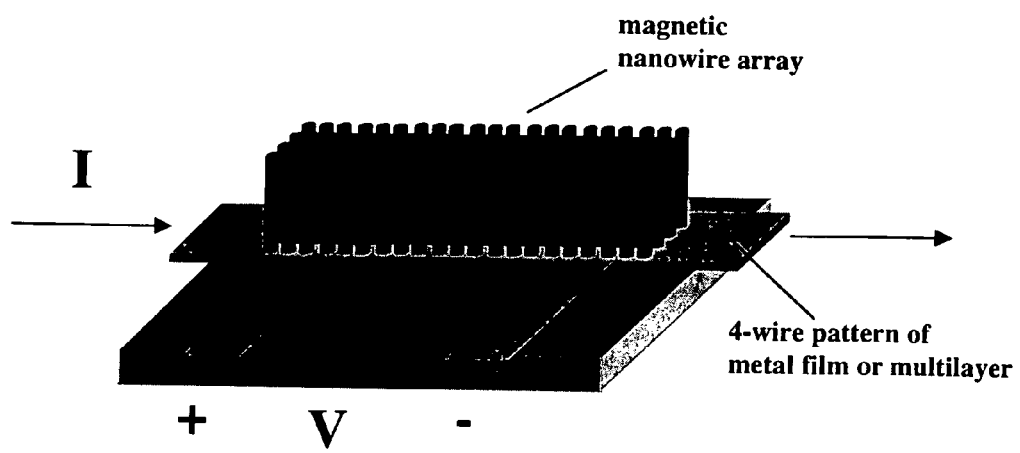
FIG. 10 is a perspective view schematic diagram of a four-wire, giant magnetoresistive (GMR) device created from laterally patterned diblock copolymer film.

A particular embodiment of a GMR device is shown in FIG. 10. The device is created by fabricating a magnetic nanoarray as described herein on a substrate patterned with an electrode. This particular magnetoresistive device is in a "lateral transport" configuration (the transport current is affected by the presence of the magnetic nanowires, but is not configured to pass through the wire along its length). Again, the matrix component of the copolymer is deleted from FIG. 10 for clarity. The nanowires for such a device are desirably asymmetric magnetic heterostructures, as described above with respect to FIG. 13c. FIG. 13c does not imply that in a given set of nanowires, all three types are used, rather that any one of the types can be employed in a set.

Smart Media Applications

"Smart media" are media that sense this environment in a particular way, and create a measurable response. This could be, for example, a chemical sensor in which the device produces an electrical current when the presence of a particular type of molecule in solution is detected. Any electrical version of patterned smart media could be integrated with other signal processing on the same chip. Another example is a sensing medium that changes color upon sensing a change in chemical environment, temperature environment, optical stimulus, or other type of stimulus. Since the diblock systems are laterally patterned, arrays with large numbers of distinct sensing elements are fabricated. Each element is a localized transducer that is integrated into an on-chip circuit.

Presently, the techniques described herein can be used to produce nanowire arrays with a nanoelement density of approximately $1.2 \times 10^{12}$ elements/in$^2$. This ultimately enables data storage technologies with storage capacities exceeding a terabit/in$^2$. Patterned versions of high-density media in which one bit of data is encoded in the magnetization of a group of magnetic nanowires are created. The patterned diblock-derived devices described herein provide a simple fabrication route to high storage densities.

Electrochemical Sensor Applications

These sensors are used in a wide range of applications, including portable glucose detection for people with diabetes. The nanoporous templates disclosed herein are used conveniently to make devices for electrochemical sensing as an array of "microelectrodes." In the electrochemistry literature the term "microelectrode" refers to a configuration of electrode that induces radial diffusion of an electrochemically-active species toward the electrode. The behavior of a microelectrode differs dramatically from that of a planar electrode. A nanoporous polymer template nanoelectrode array as described herein offers fast response, lower detection limits, and the possibility for molecular selectivity based on size or molecular interactions with the template. The lateral-patterning invention advances the use of nanoporous templates for this purpose because several distinct microelectrodes arrays are configured onto the same chip using patterned diblock templates atop a pre-patterned thin-film electrode set.

Biomolecule Array Applications

Combinatorial chips are configured for DNA gene expression studies and other diagnostic applications. The nanoporous polymer templates described herein are patterned and filled with metals or silicon oxide that are used to attach biomolecules that will enable new types of biomolecular research capabilities. Patterned versions of such structures are of far greater usefulness. Another application for lateral patterning is to create structures for sorting molecules in nanoscales.

Molecular Electronics Applications

Specific types of molecules and small colloidal clusters are used as electronic devices. The goal is to "design in" electronic functionality (e.g., rectification, switching, negative differential resistance) by synthesizing molecules using certain types of end groups, aromatic rings and side groups. Interfacing these molecules for electrical characterization using known techniques is extremely challenging. However, new patterned nanoporous templates can be used as a practical host substrate for the characterization of specific types of electronically relevant molecules. The diblock template is patterned in regions atop pre-patterned gold electrodes. The molecules are adsorbed to the gold at the bottom of each pore using a thiol-gold interaction. This results in a self-assembled monolayer of the electronic molecules at the bottom of each pore. A counter electrode is deposited electrochemically atop the molecular layer and contacted using the patterned interconnections described above. This fabrication scheme enables convenient electrical characterization of candidate molecules.

Photonic-Bandgap Structure Applications

A photonic-bandgap crystal is a optical material that has periodically modulating dielectric constant. As a consequence of the periodic structure, the transmission properties become dependent on the incident light frequency such that certain frequencies, there is no transmission (the dispersion relation $\omega(k)$ is non-linear and has derivative of zero at Brillouin zone boundaries, $k=\pi/a$, where a is the crystal lattice period). Using these materials, a range of devices can be configured in analogy to electronic devices. Once diblock copolymer systems can be made with a sufficiently long-range array order, they can be patterned in specific shapes to fabricate planar photonic-crystal waveguides and other photonic-crystal devices. Photonic waveguides are able to have much smaller turn radius as compared to optical fiber. Such waveguides can be used to interconnect on-chip optical components.

Electrical Interconnections to Nanowires

Electrical interconnections can be made to nanowires made by patterned diblock copolymer templates. This is achieved by integrating the templating process with other pre- and post-processing steps.

An important step in utilizing electrical nanostructures is making appropriate electrical interfaces to these nanostructures. In FIG. 15, one embodiment of the present invention is realized. First, electrodes are prepatterned onto the substrate by a suitable lithographic technique. Secondly, a diblock copolymer film is deposited. Next, a metal layer is deposited. Finally, a conventional (photo- or e-beam-) resist is deposited. The cylinders of the diblock copolymer can be oriented by the techniques described herein. The resulting structure is shown in FIG. 15a.

Selected areas of the top resist are exposed lithographically and removed by chemical development. Subsequently the exposed metal layer (#2) is removed by a metal etch. At this point the diblock film is exposed to ultraviolet (UV) light or an electronic beam, if it has not been exposed in a prior step. This structure is shown in FIG. 15b.

The diblock film is now chemically developed with acetic acid or another suitable developer to result in a nanoporous template. If desired, the surface of the nanoporous template can be cleaned using a reactive ion etch with oxygen. This structure is shown in FIG. 15c.

Nanowires or other suitable nanostructures are now deposited into the pores of the nanoporous template. To achieve top electrical contact, the deposition can continue until electrical connection is made with the top layer. As discussed herein, a range of different desired nanostructures can be deposited in the pores, depending on the target application. This structure is shown in FIG. 15d.

In some applications, such as field emissions arrays, electrical contact to the top layer is not desired. Rather, the isolated top metal layer would be used as an electrical gate in a triode field emission device configuration. In other applications, metal contact #2 can be replaced over the deposited nanowires to complete contact through the wires, as shown in FIG. 15e.

The integration scheme described in FIG. 15 represents only one out of several schemes for integration and interfacing nanostructures made by patterned nanoporous templates. Nanofabrication via patterned diblock copolymers can be combined easily with other (pre- and post-) process steps, and done so such that the pattern is made in registry with previous lithographic patterns.

Another fabrication scheme can be described as follows. First, electrodes are prepatterned onto the substrate by a suitable lithographic technique. Secondly, a diblock copolymer film is deposited. The diblock cyclinders are then oriented, exposed lithographically in a desired pattern, and then developed into a nanoporous template. Nanowires or other suitable nanostructures are now deposited into the pores of the nanoporous template.

To achieve top electrical contact, or top non-contact electrodes, a suitable lithographic exposure and development, a ion etch performed to remove degraded portions (for example, oxide) from the top of the nanowires, and then deposition of metal electrodes in the contact areas.

The following examples do not limit the scope of the invention described in the claims.

EXAMPLES

The following examples illustrate particular properties and advantages of some of the embodiments.

Example 1

A Prototype of a Field Emission Array

Figure 8A:
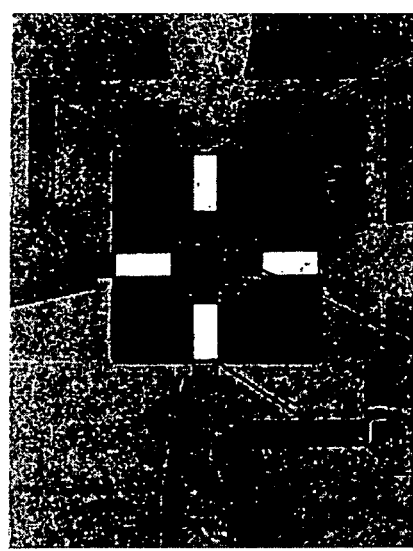
FIG. 8a is an overhead view optical image (at 5×) of a sample showing an electrode pattern with a vertically-oriented diblock copolymer film covering the surface.
Figure 8B:
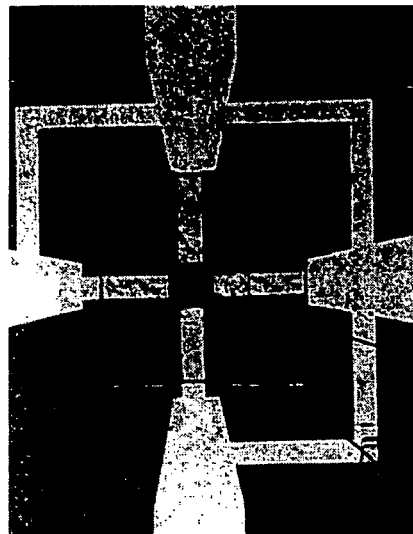
FIG. 8b is an overhead view optical image (at 5×) of the sample from FIG. 8a after electron beam patterning and removal of a copolymer component to form nanopores.
Figure 8C:
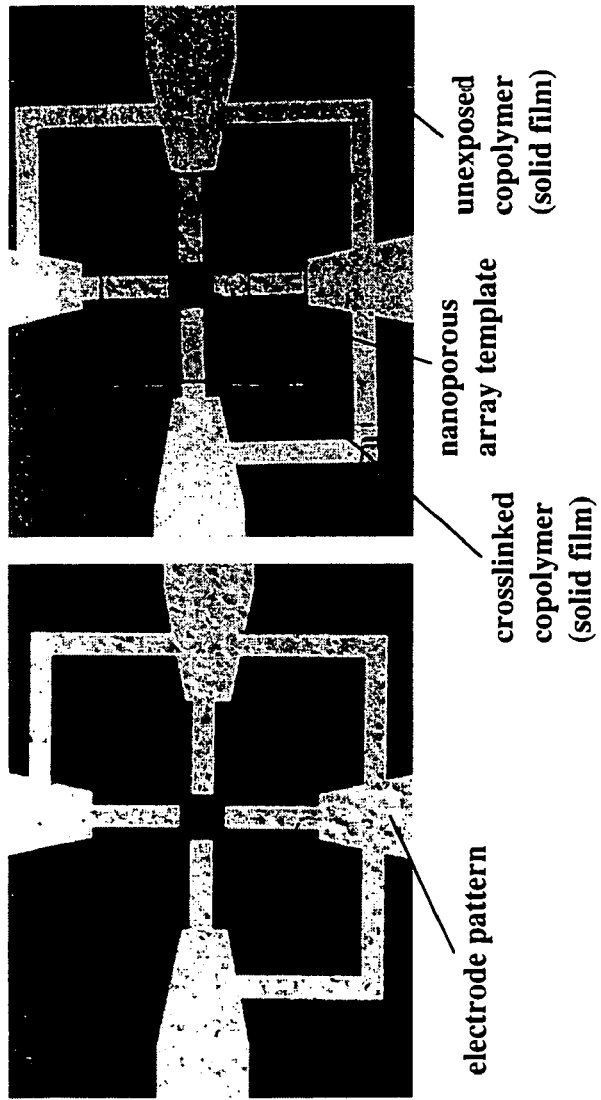
FIG. 8c is an overhead view optical image (at 5×) of the sample from FIG. 8b after nanowires are electrodeposited on the sample.
Figure 8D:
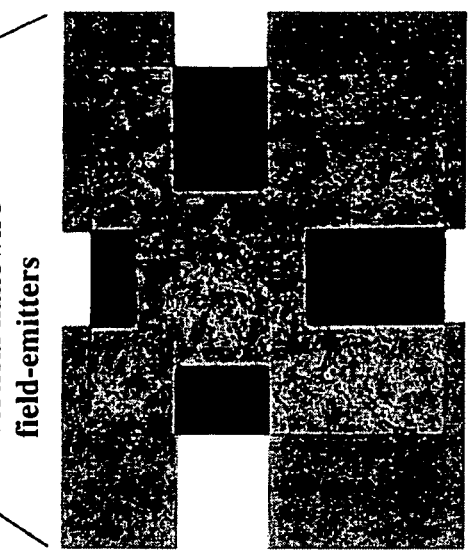
FIG. 8d is a closeup overhead view optical image (at 5×) of the sample from FIG. 8c.

FIGS. 8a–8d are 10× optical images of a prototype of a field emission array built by the inventors. In FIG. 8a, the silicon substrate was gold patterned with conventional lithography with a 1 micrometer thick, vertically oriented diblock copolymer film (polystyrene/polymethylmethacrylate, 70/30 by volume) covering the entire surface (the film is optically transparent). FIG. 8b is an image of the same sample after electron-beam patterning in the shape of a square, and acetic acid development. The inner square was a patterned nanoporous template. The outer square was a solid film of crosslinked polystyrene/polymethylmethacrylate made by intentional overexposure to radiation. FIG. 8c is an image of the same sample after 500 nm length cobalt wires were electrodeposited in the template. The cobalt is black in the image. FIG. 8d is a close-up of the electrodeposited area. It is important to note that the nanowires deposit only in the nanoporous template regions with metal underneath.

Example 2

A Prototype Magnetoresistive Device

Figure 11B:
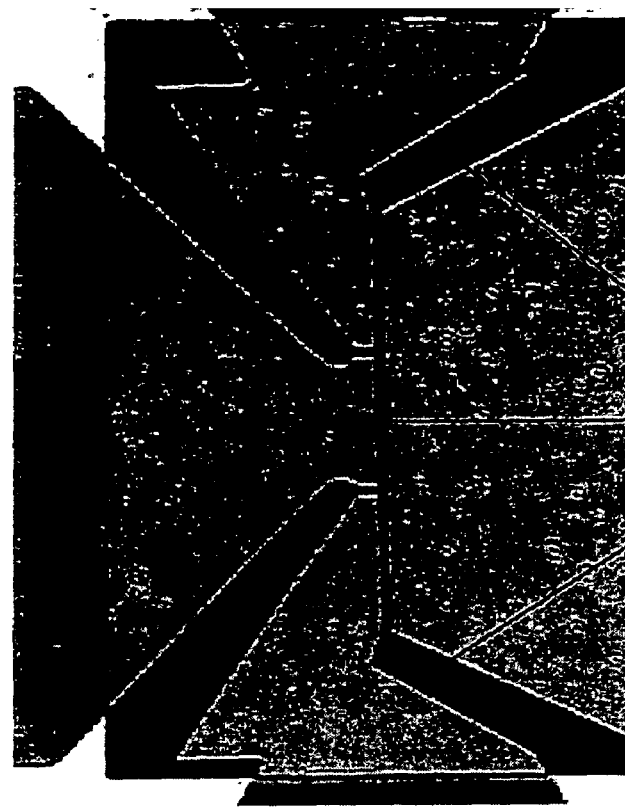
FIG. 11b is an overhead view optical image (at 10×) of a four-wire magnetoresistive device created from laterally patterned diblock copolymer film after nanowire electrodeposition.
Figure 11A:
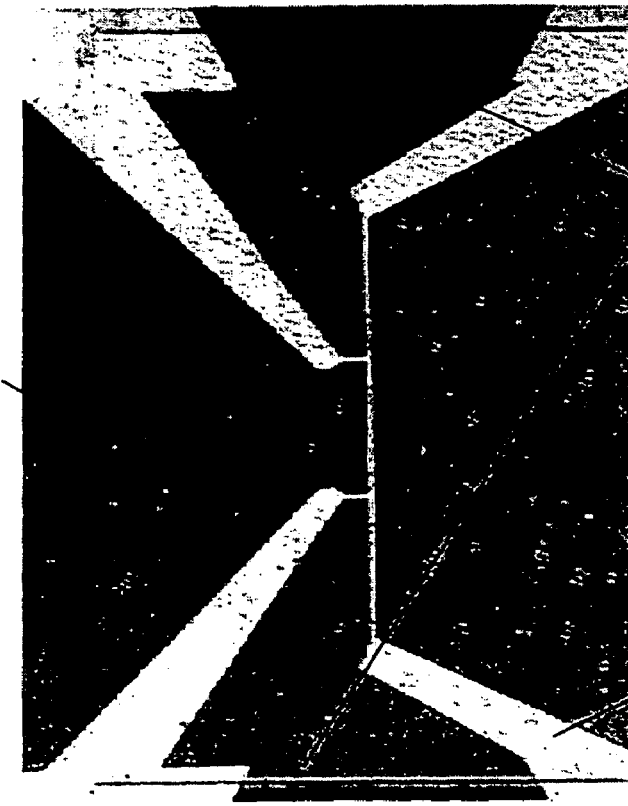
FIG. 11a is an overhead view optical image (at 10×) of a four-wire magnetoresistive device created from laterally patterned diblock copolymer film before nanowire electrodeposition.

FIGS. 11a and 11b are 10× optical images of a prototypical four-wire magnetoresistive device made by the inventors. An array of vertical magnetic nanowires stands atop a thin-film of gold pre-patterned into a four-probe resistor pattern. This device is used to investigate spin-dependent scattering in a "current-in-plane" (CIP) geometry where the scattering interface is geometrically periodic on the scale of tens of nanometers. FIG. 11a is an image of a substrate with a patterned electrode underlayer covered with an optically transparent diblock copolymer film layer prepared as described in Example 1.

The four probe resistor pattern was created as 2 μm in width and 100 μm in length, by standard electron beam lithography using a PMMA resist on a silicon substrate. The thin-film resistor includes a 20 nm thick gold layer on top of a 1 nm Cr adhesion layer. A 1.1 μm thick film of poly (styrene-β-methylmethacrylate) diblock copolymer denoted P(S-β-MMA) having 30% by volume polymethylmethacrylate (PMMA) with molecular weight of 42,000 Daltons was spun coated onto the patterned surface of substrate. This copolymer microphase separates into a hexagonal array of PMMA cylinders in a polystyrene (PS) matrix. Annealing thin films at 180° C., above the glass transition temperature under an applied electric field, orients the PMMA cylinders normal to the film surface, enabling the fabrication of nanostructures with large aspect ratios. The sample was then exposed to an electron beam impinging on the sample in the shape of a square (area dose of 50 μC/cm$^2$, with beam energy and current used is 20 kV and 2000 pA, respectively. Generally, for such diblock films of about 1 micron, the exposure dose can range from about 20 to about 200 μC/cm$^2$, with accelerating voltages and beam currents as described above. Optimal doses have been found to be about 80 μC/cm$^2$. The sample was then chemically developed with acetic acid. The original copolymer remains in the unexposed areas.

Cobalt nanowires were deposited in the pores on top of the gold pattern from an aqueous deposition bath, prepared by mixing 96 grams of CoSO$_4$.7H$_2$O and 13.5 grams H$_3$BO$_3$ in 300 ml pure H$_2$O, with 60 ml of methanol added as surfactant, resulting in an electrolyte pH of 3.7. The Co was electroplated at a reduction potential of –1.0V with respect to a saturated calomel reference electrode. The nanowires were 500 nm in length. FIG. 11b is an image of the same sample after nanowire electrodeposition.

Structural information was obtained by performing small angle X-ray scattering (SAXS) and field emission scanning electron microscopy (FESEM). The SAXS data confirms a perpendicular nanowire orientation with a period of 21.7 nm. The sample was cleaved in two, and FESEM used to examine a cross-section of the nanowire array. The diameter of the nanowires was found to be approximately 11 nm, with a period of 21.8 nm. At this scale, the individual magnetic nanowires should be single-domain in equilibrium, and show interesting magnetoresistance (MR) effects, since the interwire spacing is less than the spin diffusion length.

Example 3

Giant Magnetoresistance Device and Measurements

Figure 12A:
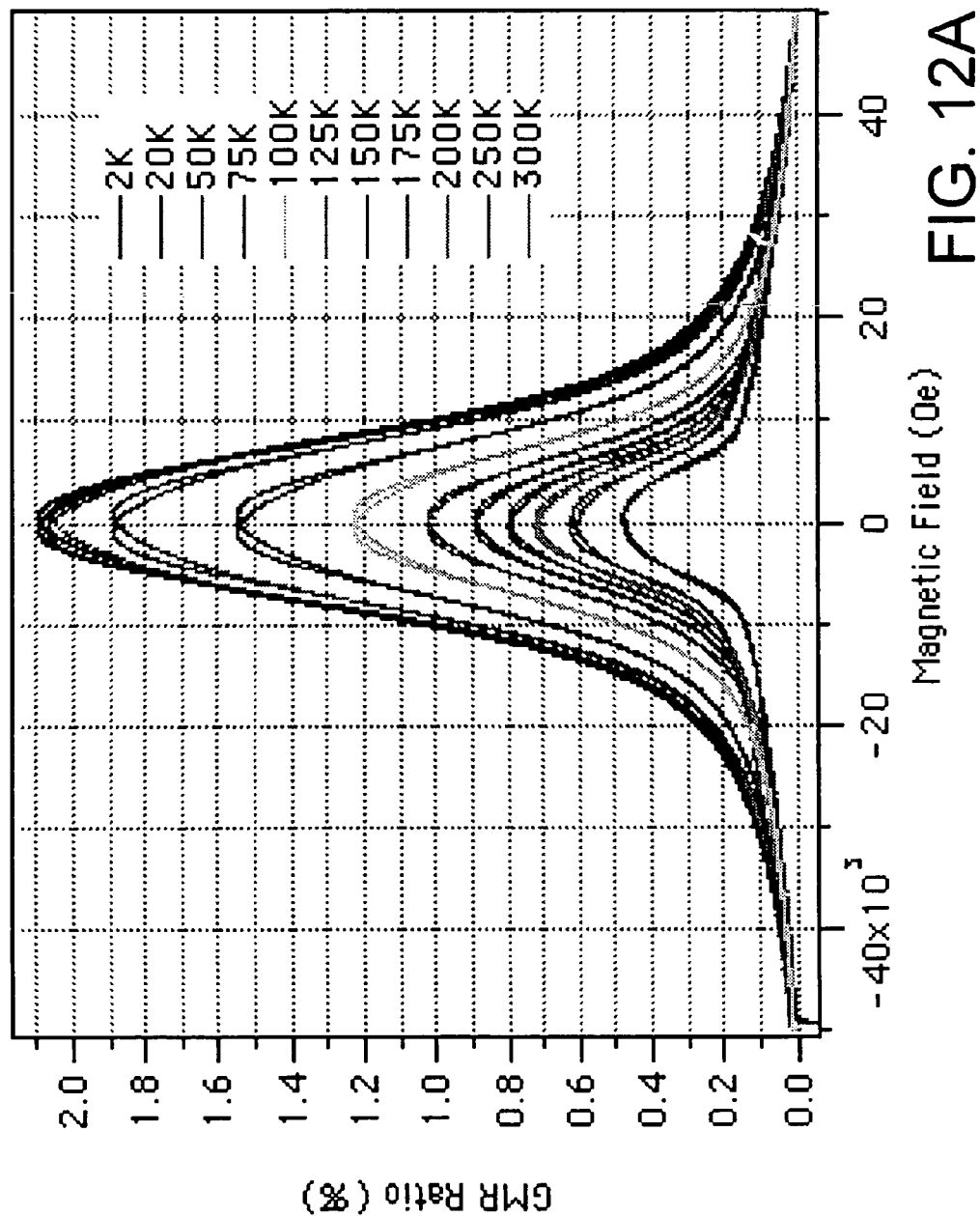
FIG. 12a is a graph of giant magnetoresistance measurements of a four-wire device as depicted in FIG. 11b, as a function of device temperature.
Figure 12B:
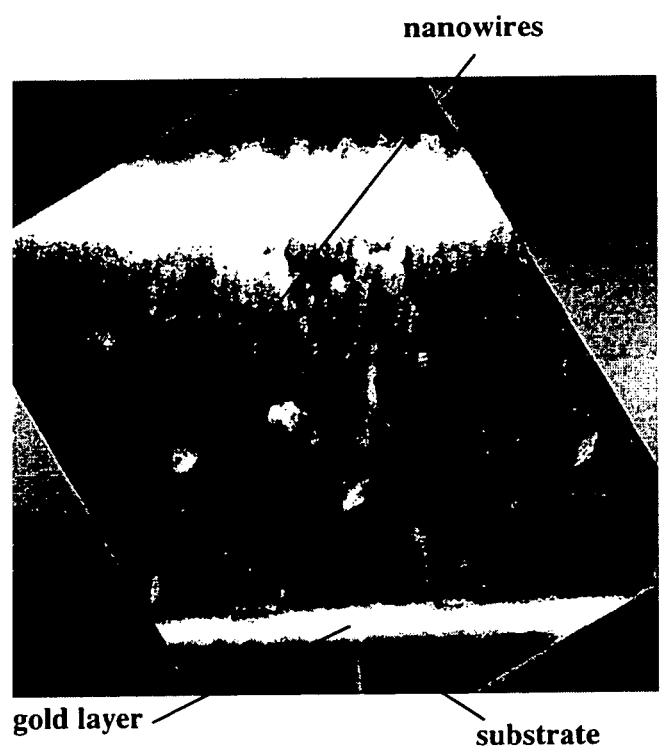
FIG. 12b is a scanning electron micrograph SEM image of vertically oriented nanowires created from laterally patterned diblock copolymer film.

The four-wire magnetoresistive device prepared in Example 2 was used for measurement. The magnetic cobalt nanowire array is composed of 14 nm diameter wires, each 500 nm long, arranged in a hexagonal lattice with a period of 24 nm. The structure of the device was verified by small-angle X-ray scattering measurements. The magnetic field direction is parallel to the nanowire axis. A cross sectional scanning electron micrograph (SEM) image of such an array is shown in FIG. 12b. The GMR ratio as a function of temperature between 2K and 300K is shown in FIG. 12a. The data taken at 2K shows the largest amplitude curve, and that taken at 300K shows the smallest amplitude curve, with intermediate temperatures having intermediate values, with amplitudes in line with the ordering of the temperature.

Other GMR ratios, as a function of orientation of magnetic field and temperature are shown in FIGS. 16a–c. The magnetoresistance is defined as [R(H)–R(50 kOe)/R(50 kOe)]. Again, the data taken at 2K shows the largest amplitude curve, and that taken at 300K shows the smallest amplitude curve, with intermediate temperatures having intermediate values, with amplitudes in line with the ordering of the temperature. In the "perpendicular" orientation (FIG. 16a), the field is normal to the plane of the Au film (parallel to the Co nanowires) and the current direction. For the "transverse" orientation (FIG. 16b) and "longitudinal" orientation (FIG. 16c), the field is in the plane of the gold film (perpendicular to the Co wires), but perpendicular or parallel to the current direction, respectively. The different shapes and values for the MR curves for the three orientations provide evidence for the coexistence of anisotropic magnetoresistance (AMR) and giant magnetoresistance (GMR) scattering mechanisms in this system.

Figure 22:
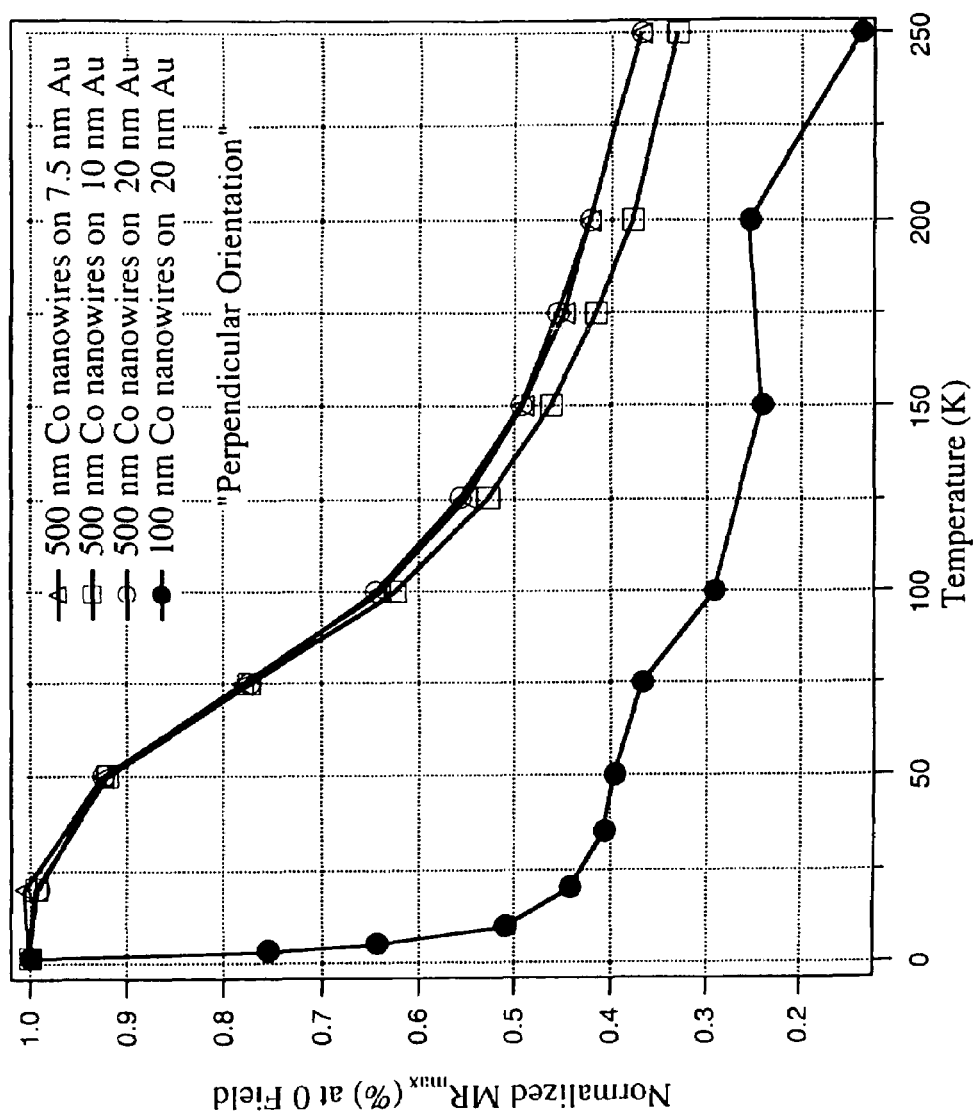
FIG. 22 is a plot of normalized MR response (%) at 0 field versus temperature, in the perpendicular orientation.

MR behavior of the Co nanowires was also investigated as a function of gold film thickness and Co nanowire length. Gold films of 7.5, 10 and 20 nm thickness were studied with Co nanowires of 500 nm. Also, samples of Co nanowire lengths of 100 and 500 nm were prepared having gold film thickness of 20 nm. MR behavior was found to depend principally on nanowire length. A plot of normalized MR$_{max}$ for a perpendicular orientation at 0 field versus temperature for various gold film thicknesses and Co nanowire lengths is shown in FIG. 22. The characteristics clearly indicate that the temperature dependence of MR is strongly dependent on the Co nanowire length, but not so strongly on the gold film thickness. Each data set is normalized to its 2K value for comparison.

OTHER EMBODIMENTS

It is to be understood that while the invention has been described in conjunction with the detailed description thereof, that the foregoing description is intended to illustrate and not limit the scope of the invention, which is defined by the scope of the appended claims. Other aspects, advantages, and modifications are within the scope of the following claims.

What is claimed is:

1. A method of interfacing an electrical connection with a multilayer nanostructure, the method comprising:
   preparing a diblock copolymer layer on a substrate surface, wherein the diblock copolymer layer comprises a matrix component and a core component, and at least a portion of the substrate surface is conductive or semiconductive;
   depositing a metal layer on at least a portion of the diblock copolymer layer;
   orienting the core component of the diblock copolymer layer to form a plurality of nanoscopic cylinders parallel to each other within the diblock copolymer layer and oriented with respect to the substrate surface;
   removing at least a portion of the oriented core component from the diblock copolymer layer to form a patterned array of nanopores in the diblock copolymer layer, wherein the diblock copolymer layer comprises a first region comprising nanopores and a second region comprising no nanopores to form the patterned array of nanopores; and at least partially filling at least some of the nanopores with a material.

2. The method of claim 1, further comprising depositing a resist layer on at least a portion of the metal layer prior to orienting the copolymer.

3. The method of claim 1, wherein the removal of at least a portion of one component from the oriented copolymer is performed by exposure to radiation.

4. The method of claim 3, wherein the radiation comprises ultraviolet light, x-ray radiation, gamma radiation, visible light, heat, or electron beam radiation.

5. The method of claim 3, wherein the exposure to radiation includes using a mask to produce a radiation pattern on the oriented copolymer.

6. The method of claim 3, wherein the exposure to radiation includes using an electron beam writer to expose portions of the oriented copolymer to the radiation.

7. The method of claim 3, wherein removal of at least a portion of one component from the oriented copolymer by exposure to radiation comprises selectively exposing the oriented copolymer to radiation.

8. The method of claim 7, wherein the selective exposure to the radiation corresponds to an electrode pattern on a surface of the substrate.

9. The method of claim 1, wherein the material used to at least partially fill at least some of the nanopores comprises magnetic material.

10. The method of claim 9, wherein the magnetic material comprises at least one material selected from the group consisting of cobalt, nickel, iron, rare earth magnetic materials, and magnetic ceramic materials.

11. The method of claim 1, wherein preparing the diblock copolymer comprises spin casting a solution of the diblock copolymer on the substrate surface.

12. The method of claim 1, wherein the diblock copolymer is oriented by directed self assembly.

13. The method of claim 12, wherein the diblock copolymer is oriented by applying an external field to the diblock copolymer.

14. The method of claim 13, wherein the external field is an electric field, a magnetic field, a thermal gradient, a concentration gradient, or a combination thereof.

15. The method of claim 1, wherein the diblock copolymer comprises a major component having a volume fraction of about 0.65 to about 0.9.

16. The method of claim 1, wherein preparing the diblock copolymer comprises crosslinking at least a portion of the diblock copolymer.

17. The method of claim 1, wherein the diblock copolymer is oriented while heating the diblock copolymer.

18. The method of claim 1, wherein the at least partially filled nanopores form nanowires that have a length of at least 20 nm.

19. The method of claim 1, wherein the at least partially filled nanopores form nanowires that have a length of at least 100 nm.

20. The method of claim 1, wherein the diblock copolymer is oriented so that the nanoscopic cylinders are hexagonally packed.

21. The method of claim 1, wherein the removal of at least a portion of one component from the oriented copolymer is performed by exposure to a degradation or decomposing agent.

22. The method of claim 21, further comprising treating the copolymer with an agent that selectively removes the degraded portions to form the patterned array of nanopores.

23. The method of claim 1, wherein at least some of the nanopores are partially filled by electrodeposition, chemical vapor deposition, electroless deposition, surface chemistry, chemical adsorption, or chemically driven layer-by-layer deposition.

24. The method of claim 1, further comprising lithographically patterning a layer of a metallic or semiconductive material on the substrate prior to preparing the diblock copolymer on the substrate surface.

25. The method of claim 1, wherein the at least partially filled nanopores form cylinders that are arranged in groups corresponding to the patterned array.

26. The method of claim 25, wherein at least one of the groups is in the shape of a circle, square, rectangle, or triangle.

27. The method of claim 25, wherein the cylinders in at least one group comprise a magnetic material and have an overall magnetization oriented in one direction, and the cylinders in at least one other group comprise a magnetic material and have an overall magnetization in an opposite direction.

28. The method of claim 25, wherein at least some of the cylinders in one group are in electrical contact with at least some of the cylinders in another group.

* * * * *